(12) United States Patent
Krames et al.

(10) Patent No.: US 7,268,371 B2
(45) Date of Patent: Sep. 11, 2007

(54) LIGHT EXTRACTION FROM A SEMICONDUCTOR LIGHT EMITTING DEVICE VIA CHIP SHAPING

(75) Inventors: Michael R Krames, Mt View, CA (US); Fred A Kish, Jr., San Jose, CA (US); Tun S Tan, Cupertino, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 68 days.

(21) Appl. No.: 11/230,722

(22) Filed: Sep. 19, 2005

(65) Prior Publication Data

US 2006/0011935 A1 Jan. 19, 2006

Related U.S. Application Data

(60) Continuation of application No. 10/867,936, filed on Jun. 14, 2004, now Pat. No. 6,946,309, which is a division of application No. 10/095,552, filed on Mar. 11, 2002, now Pat. No. 6,784,463, which is a continuation-in-part of application No. 09/732,326, filed on Dec. 6, 2000, now Pat. No. 6,570,190, which is a continuation of application No. 08/868,009, filed on Jun. 3, 1997, now Pat. No. 6,229,160.

(51) Int. Cl.
*H01L 29/22* (2006.01)
*H01L 29/227* (2006.01)

(52) U.S. Cl. ............... 257/98; 257/95; 257/94; 257/103; 257/13; 257/79; 257/E33.006; 257/E33.071

(58) Field of Classification Search ............ 257/94, 257/95, 98, 103, 79, 13, E33.006, E33.071
See application file for complete search history.

(56) References Cited

U.S. PATENT DOCUMENTS

| 4,218,692 A | 8/1980 | de Cremoux |
| 4,369,458 A | 1/1983 | Thomas et al. |

(Continued)

FOREIGN PATENT DOCUMENTS

DE 24 16 098 A1 10/1975

(Continued)

OTHER PUBLICATIONS

G-SiC® Technology—Ultra Bright LEDs—CXXX UB290-E1000, CREE product paper, 1 page.

(Continued)

*Primary Examiner*—Kenneth Parker
*Assistant Examiner*—Joseph Nguyen
(74) *Attorney, Agent, or Firm*—Patent Law Group LLP; Brian D. Ogonowsky

(57) ABSTRACT

A method for designing semiconductor light emitting devices is disclosed wherein the side surfaces (surfaces not parallel to the epitaxial layers) are formed at preferred angles relative to vertical (normal to the plane of the light-emitting active layer) to improve light extraction efficiency and increase total light output efficiency. Device designs are chosen to improve efficiency without resorting to excessive active area-yield loss due to shaping. As such, these designs are suitable for low-cost, high-volume manufacturing of semiconductor light-emitting devices with improved characteristics.

17 Claims, 19 Drawing Sheets

U.S. PATENT DOCUMENTS

| | | | |
|---|---|---|---|
| 4,416,054 A | 11/1983 | Thomas et al. |
| 4,485,391 A | 11/1984 | Poulain et al. |
| 4,827,290 A | 5/1989 | Yoritomo et al. |
| 5,060,027 A | 10/1991 | Hart et al. |
| 5,087,949 A | 2/1992 | Haitz |
| 5,187,547 A | 2/1993 | Niina et al. |
| 5,218,223 A | 6/1993 | Spaeth et al. |
| 5,233,204 A | 8/1993 | Fletcher et al. |
| 5,260,588 A | 11/1993 | Ohta et al. |
| 5,376,580 A | 12/1994 | Kish et al. |
| 5,387,804 A | 2/1995 | Suzuki et al. |
| 5,502,316 A | 3/1996 | Kish et al. |
| 5,506,451 A | 4/1996 | Hyugaji |
| 5,517,039 A | 5/1996 | Holonyak, Jr. et al. |
| 5,621,225 A | 4/1997 | Shich et al. |
| 5,661,316 A | 8/1997 | Kish, Jr. et al. |
| 5,668,386 A | 9/1997 | Makiuchi et al. |
| 5,705,834 A | 1/1998 | Egalon et al. |
| 5,714,014 A | 2/1998 | Horikawa |
| 5,757,829 A | 5/1998 | Jiang et al. |
| 5,779,924 A | 7/1998 | Krames et al. |
| 5,780,321 A | 7/1998 | Shich et al. |
| 5,783,477 A | 7/1998 | Kish, Jr. et al. |
| 5,793,062 A | 8/1998 | Kish, Jr. et al. |
| 5,917,202 A | 6/1999 | Haitz et al. |
| 5,923,053 A | 7/1999 | Jakowetz et al. |
| 5,923,951 A | 7/1999 | Goossen et al. |
| 5,940,683 A | 8/1999 | Holm et al. |
| 6,005,262 A | 12/1999 | Cunningham et al. |
| 6,015,719 A | 1/2000 | Kish, Jr. et al. |
| 6,066,862 A | 5/2000 | Chang et al. |
| 6,088,378 A | 7/2000 | Furukawa |
| 6,111,272 A | 8/2000 | Heinen |
| 6,172,382 B1 | 1/2001 | Nagahama et al. |
| 6,221,683 B1 | 4/2001 | Nirschl et al. |
| 6,222,207 B1 | 4/2001 | Carter-Coman et al. |
| 6,229,160 B1 | 5/2001 | Krames et al. |
| 6,287,947 B1 | 9/2001 | Ludowise et al. |
| 6,307,218 B1 | 10/2001 | Steigerwald et al. |
| 6,323,063 B2 | 11/2001 | Krames et al. |
| 6,417,019 B1 | 7/2002 | Mueller et al. |
| 6,458,612 B1 | 10/2002 | Chen et al. |
| 6,462,358 B1 | 10/2002 | Lin et al. |
| 6,486,499 B1 | 11/2002 | Krames et al. |
| 6,492,661 B1 | 12/2002 | Chien et al. |
| 6,547,249 B2 | 4/2003 | Collins, III et al. |
| 6,570,190 B2 | 5/2003 | Krames et al. |

FOREIGN PATENT DOCUMENTS

| | | |
|---|---|---|
| DE | 196 29 920 A1 | 2/1997 |
| EP | 0 001 728 A1 | 9/1978 |
| EP | 0 051 505 A1 | 10/1981 |
| EP | 0 350 242 A2 | 1/1990 |
| EP | 0 415 541 B1 | 10/1994 |
| EP | 0 779 666 A2 | 6/1997 |
| EP | 0 551 001 B1 | 9/1999 |
| FR | 2 649 537 A1 | 1/1991 |
| GB | 2 072 946 A | 10/1981 |
| JP | 63-152179 A | 6/1988 |
| JP | 03-035568 | 2/1991 |
| JP | 9199759 | 7/1997 |
| JP | 2 964 822 | 10/1999 |

OTHER PUBLICATIONS

Richard Dixon, "Cree and AXT make brighter LEDs," Compound Semiconductor, Dec. 2001, LED News, p. 9.

"UEC unvails new wafer-bonded AlInGaP LED structure," CS-Max Conference Report, Compound Semiconductor, Sep. 2001, p. 51.

R.H. Horng et al., "Wafer Bonding of 50-mm Diameter Mirror Substrates to AlGaInP Light-Emitting Diode Wafers," Journal of Electronic Materials, vol. 30, No. 8, 2001, pp. 907-910.

Co-pending application entitled: "Multi-Layer Highly Reflective Ohmic Contacts for Semiconductor Devices," U.S. Appl. No. 09/469,652, filed Dec. 22, 1999, 19 pages including drawings.

Co-pending application entitled: "Light Emitting Diodes with Improved Light Extraction Efficiency," U.S. Appl. No. 09/660,317, filed Sep. 12, 2000, 37 pages including drawings.

Translation from Japanese Application No. 61-300765 entitled "Semiconductor Light-Emitting Element".

English Language Abstract to FR 2 649 537 A1, 1 page.

Patent Abstracts of Japan, Patent No. 63-152179(a), 1 page.

English Language translation of DE 24 16 098 A1, 9 pages.

W.N. Carr, "Photometric Figures Of Merit For Semiconductor Luminescent Sources Operating In Spontaneous Mode," Infrared Physics, 1996, vol. 6, pp. 1-19.

Zh. I. Alferov et al., "Efficient Al-Ga-As Heterojunction Light-Emitting Diode", Sov. Phys. Tech. Phys. 23(4), Apr. 1978, pp. 476-480.

A.R. Franklin and R. Newman, "Shaped Electroluminescent GaAs Diodes", Journal of Applied Physics, vol. 35, No. 4, Apr. 1964, pp. 1153-1155.

J. A. Dobrowski, "Coatings and Filters", Division of Physics, National Research Council of Canada, Ottawa, Ontario, Section 8, pp. 8-1 thru 8-124, 1972.

G. E. Hofler et al., "Wafer Bonding of 50-mm Diameter GaP to AlGaInP-GaP Light-Emitting Diode Wafers," Appl. Phys. Lett. 69(6), Aug. 5, 1996, pp. 803-805.

LIGHT EXTRACTION FROM A SEMICONDUCTOR LIGHT EMITTING DEVICE VIA CHIP SHAPING

CROSS REFERENCE TO RELATED APPLICATIONS

This is a continuation of U.S. patent application Ser. No. 10/867,936 filed on Jun. 14, 2004, now U.S. Pat. No. 6,946,309, which is a divisional of U.S. patent application Ser. No. 10/095,552 filed on Mar. 11, 2002, now U.S. Pat. No. 6,784,463, which is a continuation in part of U.S. patent application Ser. No. 09/732,326 filed on Dec. 6, 2000, now U.S. Pat. No. 6,570,190, which is a continuation of U.S. patent application Ser. No. 08/868,009 filed on Jun. 3, 1997, now U.S. Pat. No. 6,229,160. U.S. Pat. Nos. 6,229,160, 6,570,190, 6,784,463, and 6,946,309 are incorporated herein by reference in their entirety.

BACKGROUND

1. Field of Invention

Embodiments of the invention relate to the process of designing and fabricating semiconductor light-emitting devices. In particular, embodiments of the invention are directed towards improving the light extraction efficiency and increasing the total light output of these devices.

2. Description of Related Art

The extraction efficiency of semiconductor light-emitting devices (LEDs) is limited by the large contrast between the optical refractive indices of semiconductor materials ($n_s$~2.2-3.6) and that of the surrounding media, typically air ($n_a$~1.0) or optically transparent epoxy ($n_e$~1.5). This large difference in refractive indices causes photons within the device to have a high probability of being totally-internally-reflected (TIR) when impinging on interfaces between the semiconductor and the ambient media.

To illustrate, for a cube of GaP (optically transparent for wavelengths>555 nm) surrounded by epoxy, a photon λ>555 nm within the GaP ($n_s$~3.3) striking one of the six interfaces with epoxy ($n_e$~1.5) must impinge at an angle less than $\theta_c$~27° (relative to normal) to avoid being TIR. This constrained range of angles for which transmission is possible defines an "escape cone" for the photon. If the photon is emitted from within the GaP with an equal probability of emission in any direction within $4\pi$ steradians, the probability of striking any of the interfaces within an escape cone is 33%. Accounting for Fresnel reflection, the probability of the photon actually being transmitted into the epoxy is 28.4%.

Commercial LEDs are non-ideal devices that contain many optical loss mechanisms, e.g. active layer re-absorption, absorption within internal epitaxial layers, finite ohmic contact reflectivity, free-carrier absorption within doped regions. In particular, for devices with emission layers of low internal quantum efficiency, the loss mechanisms due to the active layer can limit extracted light to only those photons which escape the device without making a second pass through the active layer after emission. This suggests a limit on the achievable extraction efficiency of such devices to not much more than 28.4% (based on the above calculation). To illustrate, the coefficient of absorption for a band-to-band process at the emission wavelength is on the order of $10^4$ cm$^{-1}$. A photon making a single pass through an emission layer of typical thickness of 1 µm, has a probability of being absorbed equal to 63%. For low quantum efficiency material, the probability of re-emission as a photon is relatively low, for example ~10%. Thus the first-order probability of the initial photon being absorbed and converted to a non-radiative process is 57%. The problem is exacerbated by other loss mechanisms and by the fact that a majority of photon trajectories traverse more than just the vertical thickness of the active layer. Thus, much of the light escaping the device is light that is transmitted through the semiconductor/ambient interfaces immediately upon first impinging such an interface. This light is "first-pass" light. FIG. 1 shows a schematic diagram depicting first-pass light and some of the aforementioned photon loss mechanisms and paths for escape. "Multiple-pass" light is the light which escapes the chip only after multiple encounters with the surfaces of the LED chip.

Some losses can be reduced by decreasing the thickness of the light-emitting active region and any other absorbing layers. However, fundamental limitations in the materials growth and device physics (e.g. carrier confinement, interfacial recombination) limit the minimum thickness of the active layer at which reasonable radiative efficiencies can be achieved. The selection of the active layer thickness (for material of low radiative efficiency) is a trade-off between internal radiative efficiency and extraction efficiency. Devices of the highest attainable extraction efficiencies will arise from semiconductor LED structure designs that provide for much of the internally emitted light being first-pass. Indeed, even in structures of relatively high internal quantum efficiency, loss due to ohmic contacts and free-carrier absorption still compel designs for more first-pass light extraction. One approach to improve light extraction is to modify the shape or geometry of the chip.

One such shape is the inverted truncated cone device, where the p-n junction is located at or close (within several µm) to the plane of truncation, as disclosed by Franklin, et al., in the Journal of Applied Physics vol. 35, 1153 (1964). The device exhibits enhanced forward-directional light emission characteristics and improved external efficiency. The shaped sidewalls of the conical portion redirect light impinging on this surface towards the top surface at near normal incidence. In Infrared Physics 6, 1(1966), Carr determined that there is a minimum top window height beyond which efficiency no longer increases and further suggests an optimal angle, $\beta_m=(\pi/2-\theta_c)/2$, where $\theta_c$ is the critical angle for total internal reflection, for maximum efficiency. This analysis neglects internal absorption and secondary reflections. The light measured is emitted only from the top surface of the device. For high-flux applications, these devices (Franklin, et al. and Carr) are suboptimum in that they do not utilize side-light which can be 40% or more of the total extracted light from an LED. Also, this device does not employ a heterojunction and would suffer reduced injection efficiency at room temperature relative to the published data at T=77 K. Furthermore, the upper extraction window for this homojunction device is not transparent to a substantial portion of the photons generated within the p-n junction active region. With the internal quantum efficiency of GaAs LEDs typically close to 100% (especially at T=77 K), the relatively low measured value of external quantum efficiency (<10% in air) indicates that omission of side-light collection and poor transparency are contributing to significantly reduced extraction efficiency in this device design.

In "Sov. Phys. Tech. Phys. 23, 476 (1978)", Alferov et. al. disclosed another shaped LED using a double-mesa structure that improves extraction efficiency by providing bounce paths that avoid the active region and back surface of the device for multiple-pass light. Mesa etching of the sidewall surfaces does not allow control over the angle of the sidewalls which is an important parameter for light extraction and die cost. Also, the double mesa device exhibits an area-ratio from top surface to active area on the order of 9 or more. This area-ratio is the number of devices that can be yielded per unit area on a wafer. Since the reduction in area yield (~9×) is significantly greater than the observed gain in extraction efficiency (<3× compared to conventional geometries), this device approach is unsuitable for cost-effective high-volume manufacturing.

In U.S. Pat. No. 5,087,949, issued Feb. 11, 1992, Haitz disclosed an LED with diagonal faces for improved light extraction. The active layer in the LEDs is located nearly adjacent to the larger-area base (away from the imaginary apex of the pyramid shape). Consequently, light-emitting regions near the perimeter of the active layer do not fully benefit from the angled sides as do the central regions of the active layer. Therefore, the effective extraction efficiency gains in such a device are limited.

III-Phosphide and III-Arsenide material systems are suitable for the fabrication of light-emitting devices that generate light having photon energies which range, respectively, from the green to the red spectral wavelength regimes and from the red to the infrared wavelength regimes. III-Phosphide material systems include any combination of group III and group V elements with phosphorous. Example III-Phosphide materials include, but are not limited to, AlP, GaP, InP, AlGaP, GaInP, AlGaInP, GaInPN, and GaInAsP. III-Arsenide material systems include any combination of group III and group V elements with arsenic. Example III-Arsenide materials include, but are not limited to, AlAs, GaAs, InAs, AlGaAs, GaInAs, AlGaInAs, GaInAsN, GaAsSb, and GaInAsP.

III-Phosphide and III-Arsenide based light-emitting devices such as light-emitting diodes and laser diodes may be employed in a variety of applications such as street lighting, traffic signals, and liquid crystal display backlighting. In such applications, it is advantageous to increase the flux (optical energy/unit time) provided by an individual light-emitting device. Unfortunately, the flux provided by conventional III-Phosphide and III-Arsenide based light-emitting devices can be limited by their conventional vertical geometry.

Referring to FIG. 12, for example, a typical conventional III-Phosphide or III-Arsenide light-emitting device 10 includes a III-Phosphide or III-Arsenide active region 12 disposed between an n-type conductive substrate 14 and p-type layer 16. P-contact 18 and n-contacts 20 are disposed on opposite sides of device 10. A suitable forward voltage applied across contact 18 and contacts 20 causes current to flow vertically through p-type layer 16, active region 12, and conductive substrate 14, and thereby causes active region 12 to emit light.

Typically, the flux provided by conventional light-emitting device 10 is reduced because a portion of the light generated in active region 12 is absorbed by conductive substrate 14. In some prior art devices light generated in active region 12 and incident on substrate 14 is absorbed because the band gap energy of substrate 14 is less than the photon energy of the generated light. In other prior art devices, in which the band gap of substrate 14 is greater than the photon energy of the generated light, substrate 14 still absorbs a portion of the generated light incident on it due to absorption by free-carriers in the substrate. These free carriers, typically generated by dopants, are necessary to support electrical conduction through substrate 14 between contact 18 and contacts 20.

Conductive substrate 14 is sometimes wafer bonded to the rest of conventional light-emitting device 10. The resulting wafer bonded interface lies somewhere between contact 18 and contact 20, and hence must be highly electrically conductive if the device is to operate efficiently. This conductivity requirement limits the material choices for the substrate. Also, the relative crystallographic orientations of the substrate and the device layer to which it is wafer bonded may be critically important to achieving low forward bias voltages (as explained in U.S. Pat. Nos. 5,66,316 and 5,783,477, both of which are incorporated herein by reference in their entirety). This complicates the manufacturing process for these devices. In addition, a conventional light-emitting device 10 having a wafer bonded substrate may also include additional layers adjacent to the wafer bonded interface in order to improve the interface's electrical properties. Unfortunately, these additional layers can absorb light emitted by active region 12.

Some conventional light-emitting devices include layers which form a distributed Bragg reflector (DBR) located between active region 12 and absorbing substrate 14. In these devices, some of the light emitted by active region 12 is redirected away from substrate 14 by the DBR. Thus, loss due to absorption in substrate 14 is reduced. The reflectivity of the DBR, which is angle dependent, typically decreases for angles away from normal incidence. Consequently, the DBR typically does not reduce absorption in substrate 14 as much as desired.

The placement of contact 18 on top of conventional light-emitting device 10, opposite from contacts 20, also limits the flux provided by device 10. In particular, contact 18 typically either absorbs light generated in active region 12, or reflects it toward absorbing substrate 14. Moreover, contact 18 is typically electrically connected to a package or a submount with a wire bond. Such wire bonds, which can be mechanically fragile and may not handle large electrical currents, also limit the maximum flux that a conventional device can provide.

In addition, active region 12 is typically separated by substrate 14 from any heat sink on which conventional device 10 is mounted. Consequently, heat generated in or near active region 12 may not be effectively dissipated and the performance of conventional device 10 is degraded.

SUMMARY

In some embodiments, by shaping a semiconductor light-emitting device (LED) such that the side surface(s) that are oriented at an angle(s) offset relative to the direction normal to the plane of the light-emitting layer, the total light extraction is increased. By employing a p-n heterojunction for high injection efficiency, and transparent windows for low-loss optical extraction out both the top and side surfaces, high total external quantum efficiencies are achieved. Finally, the device designs and fabrication techniques are suitable to high-volume manufacturing. Methods of providing transparent windows via wafer-bonding and epitaxial regrowth allow precise positioning of the p-n junction and effect control over both device characteristics and yield. The preferred device design improves overall extraction efficiency while maintaining a reasonable degree of yielded devices per unit area on a wafer.

The device shape provides an optical path from the active layer to the ambient media which minimize encounters with the optical loss mechanisms present within the device. This function is performed by shaped sidewalls that reflect light towards the top surface of the device to within the critical angle of transmission to the ambient, and which furthermore allow TIR light from the top surface to escape out the shaped sidewalls. Thus first-pass light extraction is increased. Also, while orienting light for transmission into the ambient, the shaped sidewalls also inherently provide a relatively larger volume of low-loss material through which photons may pass a number of times without encountering the absorbing active layer or ohmic contact, i.e. the solid-angle cross-section of the active layer and ohmic contact have been reduced relative to the case of a conventional chip. Furthermore, the shaped device does not require excessive multiple passes or prohibitively long mean path-lengths for photons within the device before transmission and so does not suffer as extensively due to free-carrier absorption.

In some embodiments, a light-emitting semiconductor device includes a stack of layers including an active region. The active region includes a semiconductor selected from the group consisting of III-Phosphides, III-Arsenides, and alloys thereof. A superstrate substantially transparent to light emitted by the active region is disposed on a first side of the stack. First and second electrical contacts electrically coupled to apply a voltage across the active region are disposed on a second side of the stack opposite to the first side. In some embodiments, a larger fraction of light emitted by the active region exits the stack through the first side than through the second side. Consequently, the light-emitting semiconductor device may be advantageously mounted as a flip chip to a submount, for example.

A method of forming a light-emitting semiconductor device in one embodiment includes forming a structure including a stack of semiconductor layers overlying a host substrate, attaching a superstrate to a first side of the structure, removing at least a portion of the host substrate, and forming a first and a second electrical contact on a second side of the structure opposite to the first side. The stack of semiconductor layers includes an active region comprising a semiconductor selected from the group consisting of III-Phosphides, III-Arsenides, and alloys thereof. The superstrate may be attached to structure, for example, by bonding it to the stack or by growing it on the stack using conventional growth techniques. Consequently, the light-emitting semiconductor device may include a bonded interface and may include one or more bonding layers. The superstrate may be attached to the structure either before or after the host substrate is at least partially removed. The superstrate may be attached to the side of the structure from which the host substrate was at least partially removed, or to the side of the structure opposite to that of the host substrate.

The superstrate may be shaped to enhance the efficiency with which light is extracted from the device. A lens may be attached to the superstrate or the superstrate may be formed into a lens to further enhance light extraction efficiency.

Both the light extraction efficiency and the operating power level of light-emitting semiconductor devices disclosed herein may exceed those of conventional III-Phosphide based and III-Arsenide based light-emitting semiconductor devices. Hence, the disclosed light-emitting semiconductor devices may provide higher flux than conventional devices.

Also disclosed is an array of light-emitting semiconductor devices. Each of the light-emitting semiconductor devices comprises a stack of semiconductor layers including an active region, a superstrate disposed on a first side of the stack and substantially transparent to light emitted by the active region, and first and second electrical contacts disposed on a second side of the stack opposite to the first side. The light-emitting devices may be mounted as flip chips to a common substrate (such as a printed circuit board, for example) either directly or via submounts. The active regions of at least a subset of the light-emitting semiconductor devices include a semiconductor selected from the group consisting of III-Phosphides, III-Arsenides, and alloys thereof.

DETAILED DESCRIPTION

Figure 1:
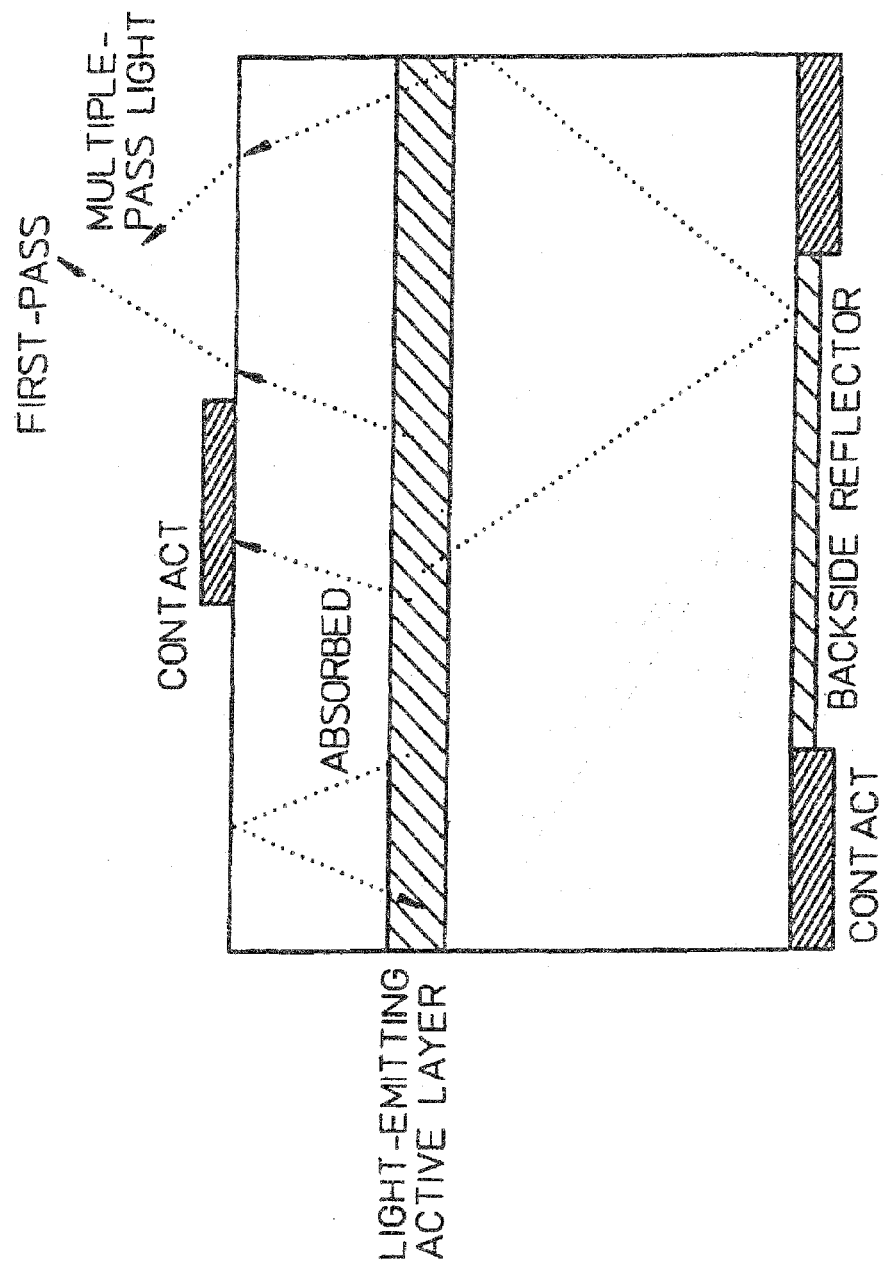
FIG. 1 is a schematic diagram illustrating light paths in a conventional light emitting device.
Figure 2:
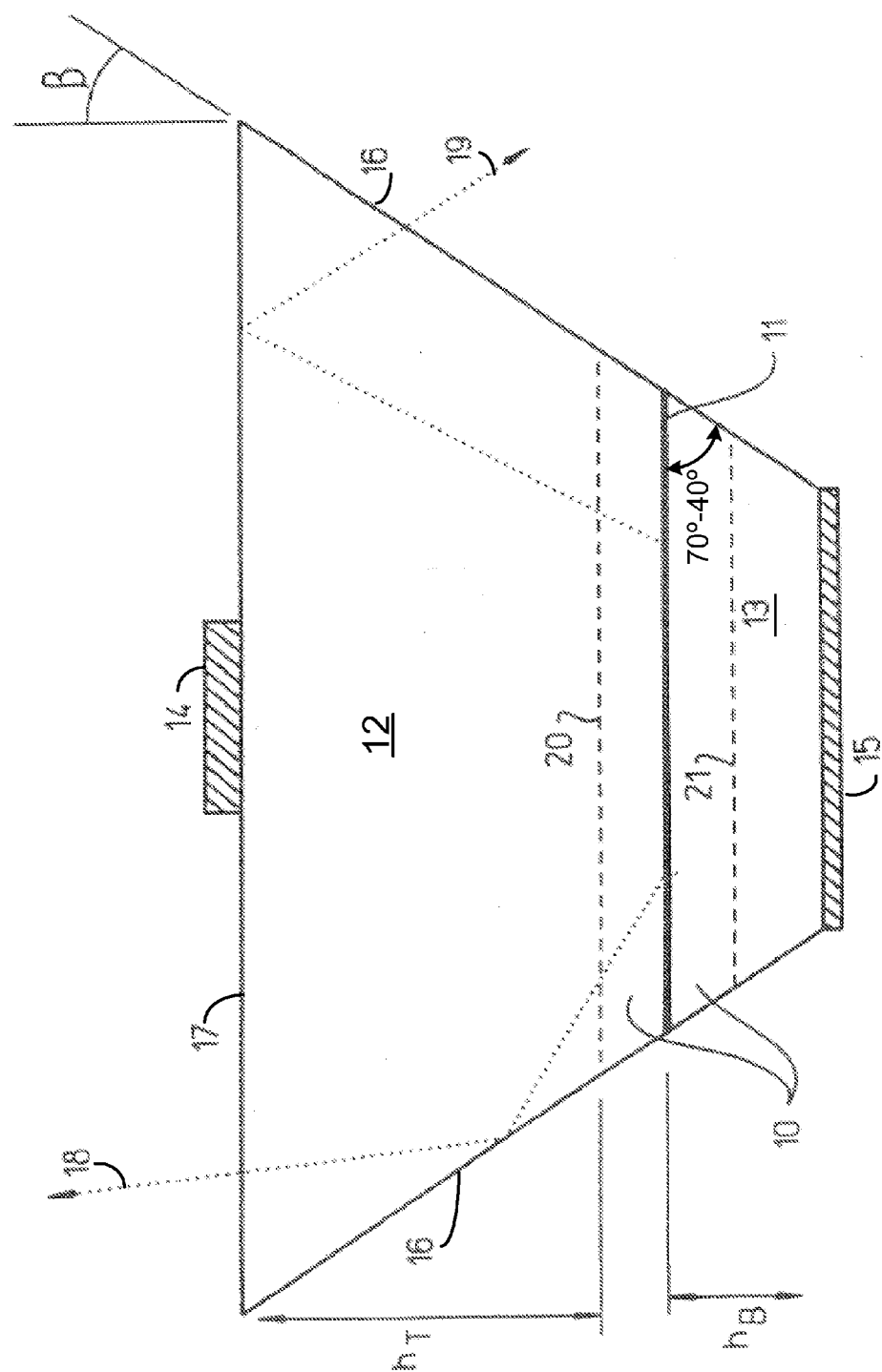
FIG. 2 illustrates a side view of a preferred embodiment.

A side-view of a preferred embodiment of a semiconductor light-emitting device (LED) is shown in FIG. 2. The LED includes a heterostructure comprising a plurality of p- and n-type doped epitaxial layers 10 grown on a substrate, e.g. GaAs, GaP, or sapphire. The p- and n-type layers are arranged to provide a p-n junction region in or near an active region 11. The resulting heterojunction provides for high injection efficiency at room temperature and is essential for devices in high-power applications. The area extent of the p-n junction region defines the active device area. For high-flux applications, the active device area is preferably greater than 150 mil$^2$.

The growth substrate may optionally be removed and replaced via wafer-bonding, e.g. Kish in U.S. Pat. No. 5,376,580, issued Dec. 27, 1994, or regrown to provide a new substrate with favored characteristics. This is desirable when the growth substrate absorbs the wavelength of light emitted from the active region. In the present invention, wafer-bonding may be used to facilitate the attachment of an arbitrary-thickness transparent window layer. A layer is transparent if its optical absorption coefficient is less than 20 $cm^{-1}$ at the wavelength corresponding to the bulk energy bandgap of the material in the active area.

A transparent substrate or layer 12, a window for light extraction (and current spreading) is the top window layer for the device. Similarly, a window layer 13 for light extraction (and current spreading) may be attached to the epitaxial layers on the side opposite the top window layer by wafer-bonding, epitaxial growth, or regrowth, to become the bottom window layer. This flexibility allows the active layer to be arbitrarily positioned within the device, facilitating the ability to trade off light-output increase vs. active-area yield per unit area on a wafer.

Top and bottom electrical ohmic contacts 14, 15 attached to the window layers allow injection of electrons and holes into the p-n junction region for recombination and the subsequent generation of light from the active region. For high power applications, the resistance of either contact should be less than 2 ohms. Preferably, the specific contact resistance of either contact is less than $5\times10^{-5}$ ohms-$cm^2$ to provide low resistance contacts with smaller areas. This allows one to minimize occlusion and absorption caused by the contacts. The p- and n-type ohmic contacts may be made on a single surface orientation of the device to minimize wire-bond connections and to reduce light occlusion caused by a top contact.

The top window layer need not be conductive, and may consist of undoped semiconductor material, crystalline or poly-crystalline, or amorphous material with suitable properties, or partially so, consisting of multiple layers with different characteristics. The material and the light-emitting layer preferably have similar refractive indices. Additionally, one or both of the contacts may be made to any or all of the side surfaces of the device.

In a preferred embodiment, the sidewalls 16 of the primary window are oriented at an angle (or angles) $\beta$ relative to the vertical direction such that the area extent of the top surface 17 is greater than that of the active device area. The sidewall makes an oblique angle with respect to the heterostructure. $\beta$ need not be constant as a function of device height (as shown in FIG. 2), but may vary continuously according to device height to result in either partially or wholly concave or convex sidewall shapes. The sidewall orientation causes light which strikes the sidewalls to be TIR into an escape cone at the top surface of the device, as shown by ray 18 in FIG. 2. Much of the light which is TIR at the top surface is redirected into an escape cone at the sidewalls, shown by ray 19. Side light accounts for ~40% or more of the total externally emitted light. This results in an increase in first-pass light extraction.

The relative increase in surface area of the semiconductor/ambient interfaces relative to that of the top contact or of the active region reduces the probability of a photon being absorbed at those regions. This latter effect is more noticeable as the angle $\beta$ and the height $h_T$ of the transparent top-window layer are increased. Although the overall light extraction theoretically increases with increasing $\beta$ and $h_T$, practical limitations arise in the choice of values of these parameters.

To illustrate, for an active region area of 20 mils×20 mils, the preferred dimensions are a side wall angle $\beta=20°$-$50°$ and top-window height $h_T=2$ to 15 mils. The sidewall angle $\beta=20°$-$50°$ corresponds to an inner angle of 70°-40° for each sidewall of window layer 13 with respect to the active layer 11. The upper limits on $\beta$ and $h_T$ are chosen with regards to maintaining a reasonable area-yield per wafer. Within this geometry, it is possible to improve the light extraction of upwardly-emitted light from the active layer by a factor of about 1.8 relative to a conventional device. Accounting for the downward-emitted light, which does not initially see the same effect, the overall effect on light extraction is on the order of 1.4. For finite absorption in the active layer and a reflective back contact, the extraction-efficiency gain of the top window is also observed by downward-emitted light, so that the gains over conventional devices may approach a factor of 1.5 or more. Even so, if absorption associated with the light-emitting layer is greater than 50% per pass, downward-emitted light cannot be expected to be efficiently redirected towards the top window. There is a benefit to providing a bottom window 13 for light extraction, as depicted in FIG. 2. This window layer should be thick enough to allow an appreciable amount of first-pass light escape out the sides of the device, while allowing a large enough bottom surface for mounting stability and heat-sinking. This layer may be 2-10 mils thick, and is preferably 10-40 of the lateral width of the active region in thickness. This design choice provides for significant out-coupling of light through the sides of the bottom window while maintaining an aspect-ratio that provides for mechanical stability. A practitioner of the art will appreciate that all dimensions scale with the area of the active region. This concept is extendable to other geometries.

Figure 3:
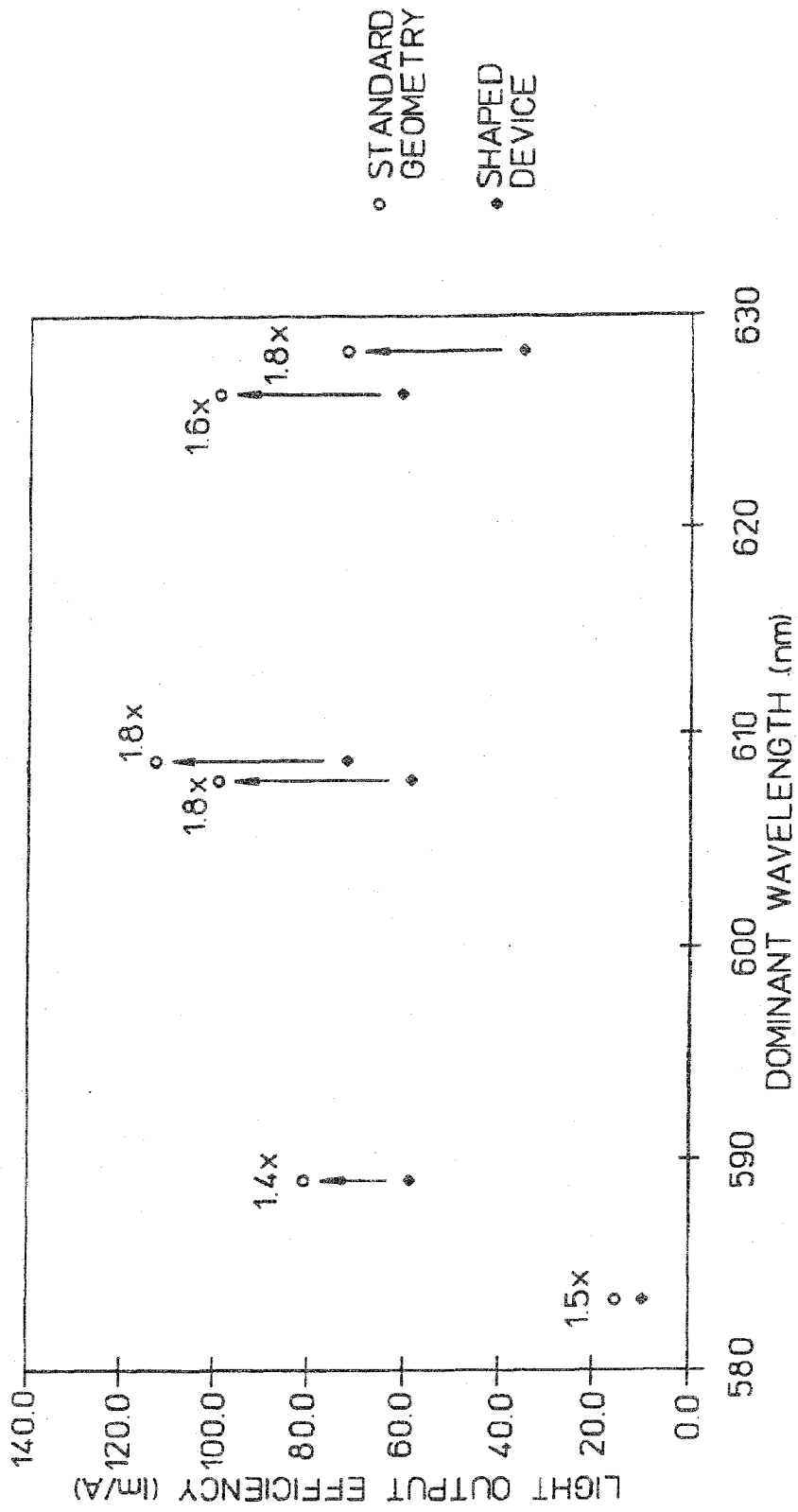
FIG. 3 exhibits experimental light extraction gains from a preferred embodiment.

Experimental observations of increased light output from shaped devices are shown in FIG. 3. These devices have a square active area (shown in FIG. 5) and four side surfaces angled at 35° relative to normal (shown in FIG. 2). The top window thickness (above the active region) is ~200 µm and the bottom window thickness (below the active region) is ~50 µm. Light output gains of 1.4×-1.8× are observed for these shaped devices relative to conventional devices (rectangular parallelipiped geometry) from the same wafer. All devices were encapsulated in epoxy (n~1.5). It can be seen from FIG. 3 that relative light output gains are observed for a wide range of wavelengths, while the absolute efficiencies depend simply on the choice of starting material.

Figure 4:
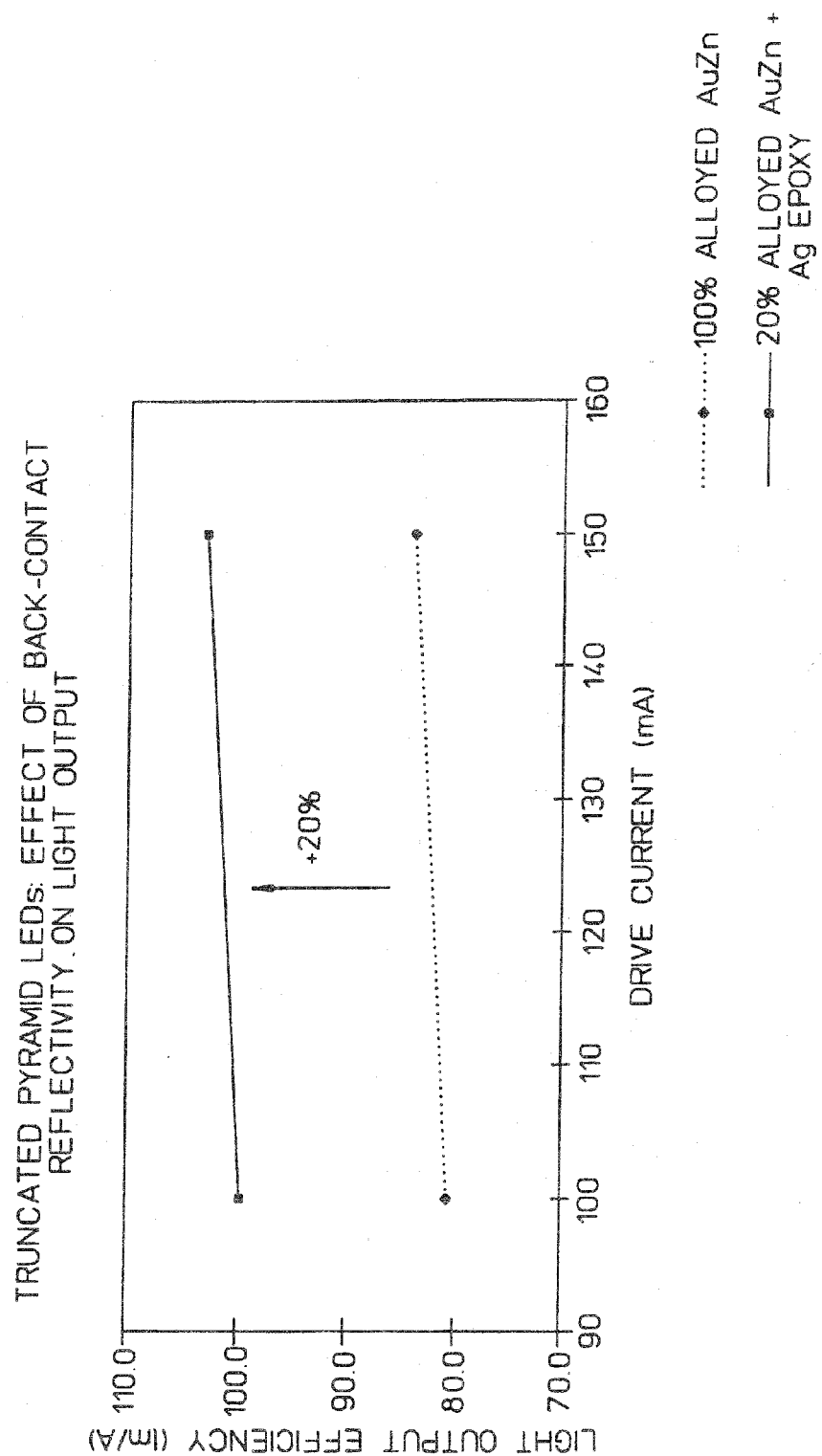
FIG. 4 exhibits further experimental light extraction gains from a preferred embodiment.

For devices with the active layer in close proximity (within 20% of the active-area width in thickness) to the bottom of the device, it is preferable to provide a highly reflecting back contact in order to achieve the highest extraction efficiency gains. Experimental data on light output of inverted truncated pyramid devices is shown in FIG. 4. Using full-sheet alloyed AuZn as a back contact, light output suffers due to the poor reflectivity provided by such a contact. Instead, by using a patterned AuZn back contact (.about.20% area coverage) in conjunction with reflective Ag-based die-attach epoxy (total angle-averaged reflectivity >~50%), total light output is increased by ~20%.

Figure 5:
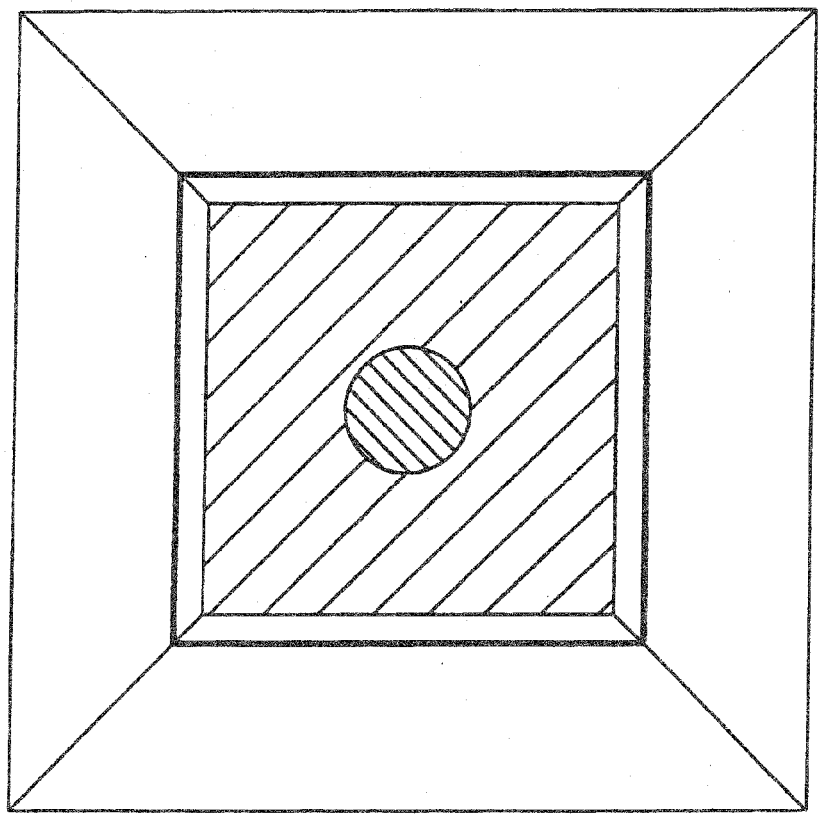
FIG. 5 illustrates a plan view of a preferred embodiment.

The side view in FIG. 2 is commensurate with a variety of device geometries. A plan view is shown in FIG. 5 for a square or rectangular base. In this inverted truncated-pyramid device, there are four distinct sidewalls of the device that are oriented at an angle (or angles) $\beta$ relative to vertical. The device may be fabricated by sawing the device wafer using a saw-blade with a beveled ("V-shaped") cutting profile to define the slant for the sidewalls. Instead the device may be fabricated by masking a portion of the wafer and forming the desired geometry by sandblasting, and by controlling the angles by varying the parameters of the sandblast operation. Further, the angles may be defined by scribing preferentially along specified crystallographic planes to form a preferred device geometry.

Another method is to suitably mask a portion of the LED wafer and form the geometry by dry or wet etching. The crystallographic nature of the substrate may be important in these cases. For example, (111) GaP may be wafer-bonded to the epitaxial layers to provide the top window layer. This material may be etched or cleaved to expose angled crystal facets that provide the angled side-surfaces for improved light extraction in a light-emitting device. If desired, the window layer may be attached by wafer bonding by including an intermediary material (e.g., transparent ITO, very thin layer of AuGe, or AuZn) to facilitate a wafer-bonded interface that is conductive and reasonably transparent. The crystallographic orientation of the substrate is chosen to effect reasonable control over chip shaping without compromising other device performance characteristics. After any initial "rough" shaping processes, it may be necessary to use "fine" shaping processes to arrive at the final desired shape and/or to produce very smooth sidewalls that are desired for a properly functioning device. In other embodiments, the device may have a different number of shaped side surfaces, e.g. three surfaces for an inverted truncated triangular-pyramid device. Photoelectrochemical etching may also be used to either shape or singulate the devices. Many device geometries will work under the principle of the present teaching, with a chosen geometry determined by the requirements of a specific device application and by cost and manufacturing considerations.

Figure 6:
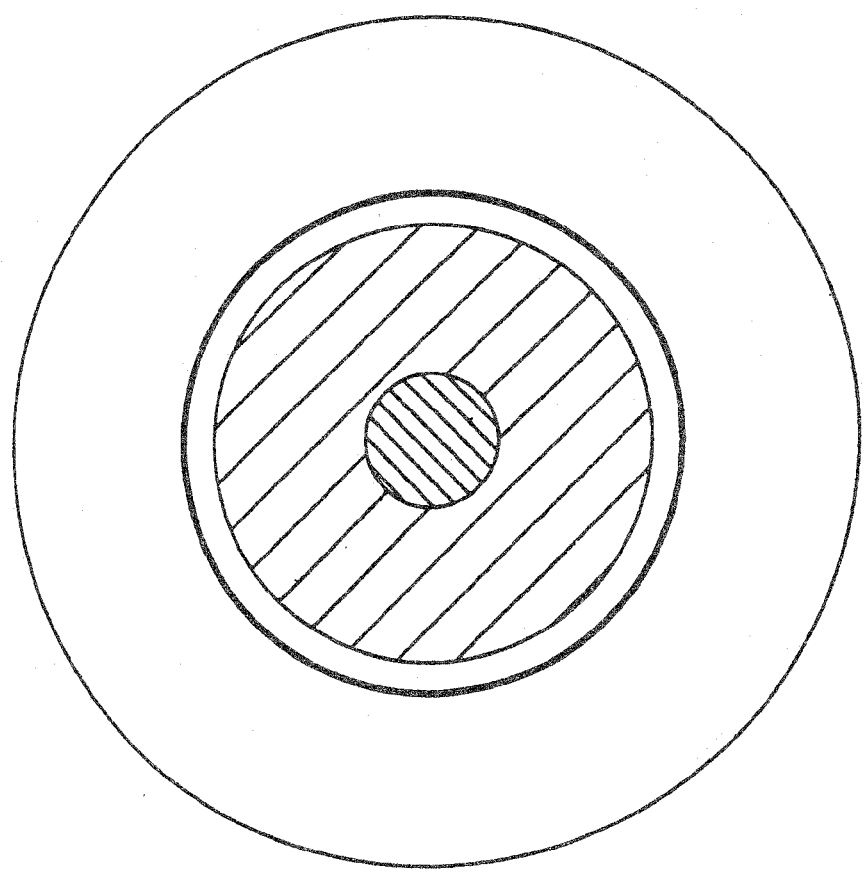
FIG. 6 illustrates a plan view of an alternate embodiment.

A plan view of an alternate embodiment is shown in FIG. 6. The inverted truncated-cone has a base that is circular (in general, elliptical). This device may be formed or approximated by proper processing of the material by any of the methods aforementioned. The radiation pattern from the conical device is axially symmetric and is advantageous for focusing or de-focusing with packaging or secondary optics.

Figure 7:
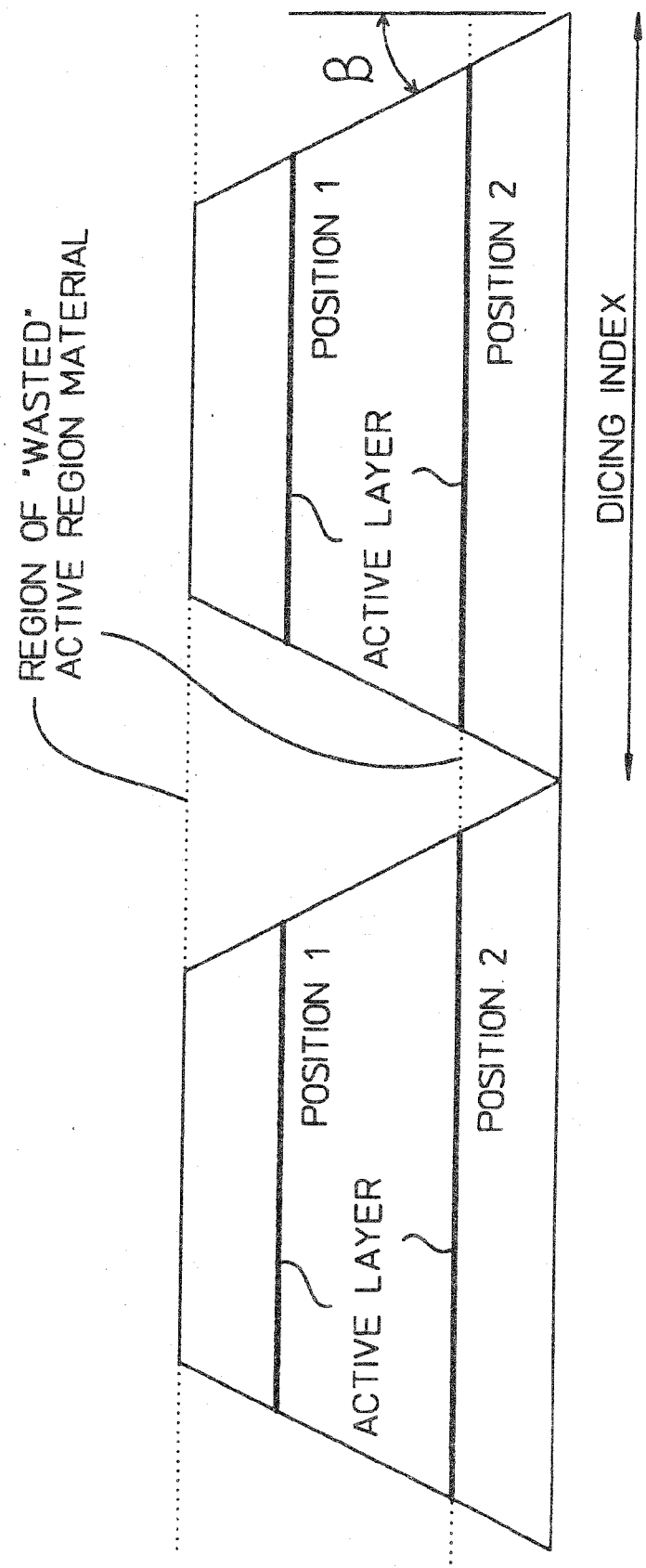
FIG. 7 illustrates a method of increasing area yield in a preferred embodiment.

A device with angled side-surfaces exhibits an increase in area-ratio of the maximum extent of the device (the top device area) relative to the active area. For a given choice of active area, this results in a reduction of the number of available devices per unit of area on a wafer (relative to conventional geometries). The importance lies in the fact that the epitaxial layers comprising the active layer and the p-n junction are typically the most expensive cost driver for the wafer. This area yield reduction increases as the top window height is increased. It also increases as the sidewall angle is increased. For a wafer being diced into inverted truncated-pyramid devices using beveled sawing (shown in FIG. 7), if the active layer is 50 μm from the top of a wafer (during dicing) that is 250 μm thick (position 1), and the dicing index is 500 μm, then the device yield per wafer for an inverted truncated-pyramid device with $\beta=30°$ would be roughly 29% relative to a conventional device. Placing the active layer closer to the bottom of the wafer during dicing, e.g. 200 μm from the wafer bottom (position 2), the device area yield increases to ~78%. That is, as the junction is moved away from the bottom of the device, the area yield loss is reduced (increasing the number of devices per wafer and thus, improving the cost-effectiveness of this device). Of course, the extraction efficiency of the device may also be reduced since the top window height of the device is effectively decreased. However, the decrease in efficiency with junction placement will be less severe as the absorption of the active layer is reduced (either by increasing the internal quantum efficiency of the active layer or by decreasing the active layer thickness) since photons may survive more passes through the active layer before being absorbed without re-emission. For example, in reducing the active layer thickness from 1.0 to 0.1 μm, the increase in transmission per pass (vertically) is from 37% to 90%. Cost-effective solutions must account for junction placement, sidewall angle, window height(s), and internal efficiency of the active area along with loss mechanisms, e.g. absorbing ohmic contacts, for proper device design. This is one aspect of the present invention. It is preferable to have a wide range of control over junction placement within the device. Positioning the location of the junction allows the design of an LED with a large extraction efficiency improvement (>1.4×) that more closely matches the added cost of manufacturing due to active-area yield loss. Based on the expected light output gains (>1.4×), it is preferable to maintain an area yield >33%.

There are several arguments for maintaining an area-yield due to chip-shaping that is greater than 33%. For one, typical yields for high-volume fabrication of mature-technology LEDs are in the range of ~30-50%. It is preferable to maintain an area-yield that is at least on par with that of conventional LED yields so that shaping alone does not put a hard upper-limit on achievable improvements in yields. Secondly, we have fabricated many shaped LEDs with geometries that correspond to area-yields >33% and which exhibit extraction efficiency gains >1.4× over conventional devices. Finally, for certain systems applications it is acceptable to triple the die-cost in exchange for a 40% gain in efficiency, especially since the die-cost makes up only a fraction of the total cost of the system.

In the trade-off between yield and extraction efficiency, a cost-effective solution is possible by changing device height, sidewall angle, and junction position parameters. Device height is controlled by substrate thickness, e.g. sawing, lapping, polishing, or etching, or layer growth times. Sidewall angle is determined by the fabrication technique, and can be very well-defined, e.g. beveled sawing, photoelectrochemical etching, or crystallographic etching. Junction position is controlled by growth times to a certain extent (epitaxial windows), but the full range of junction positions is more readily obtained by varying the thickness of wafer-bonded layers. For example, the active layer may be positioned almost exactly in the center of a 8-mil high device by simply wafer-bonding 4-mil substrates on either side.

Figure 8:
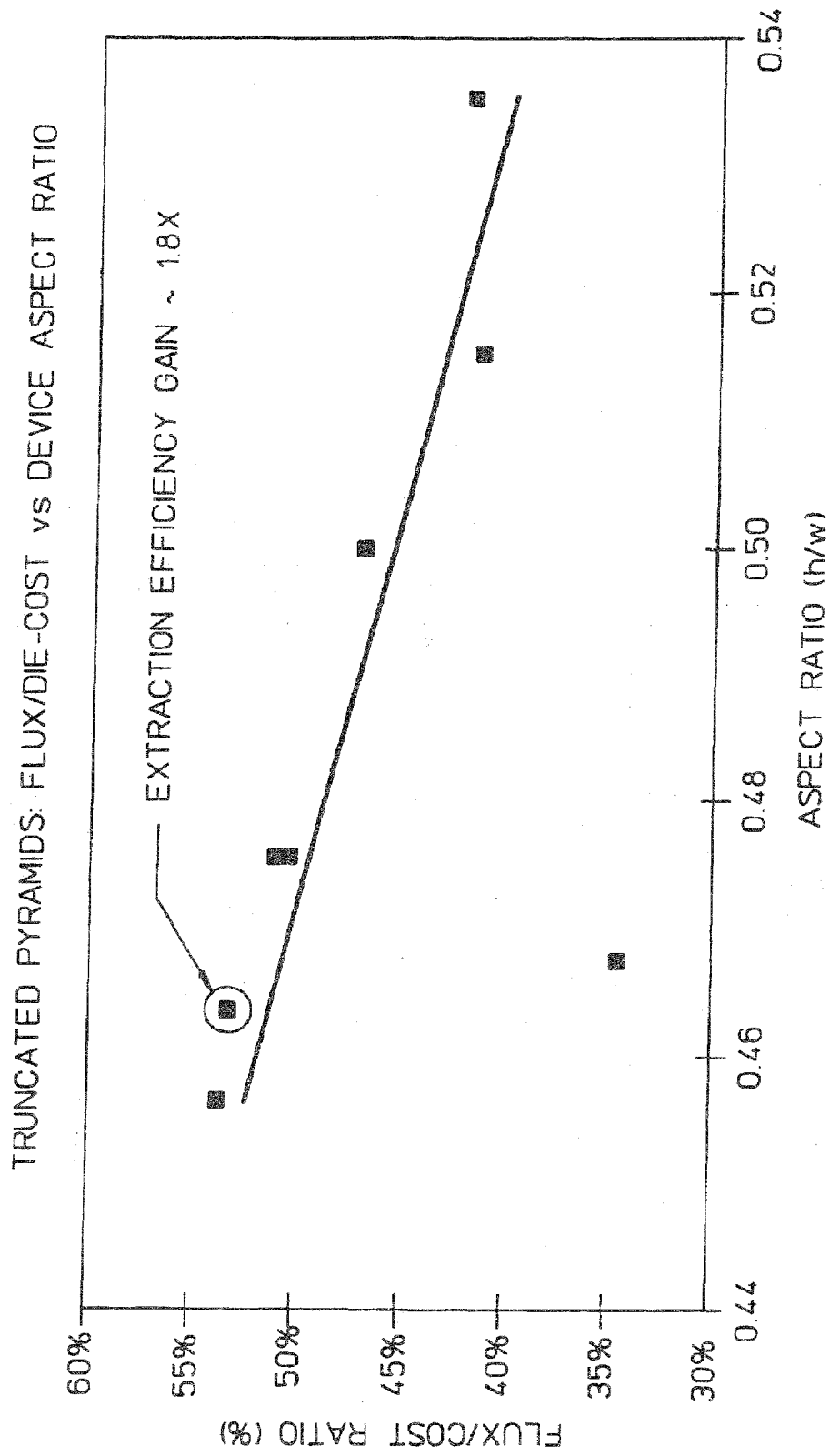
FIG. 8 illustrates relationships between flux gain and die cost in several preferred embodiments.

A consequence of device geometry on total flux gain including area yield is illustrated in FIG. 8. Here is plotted, on the y-axis, experimental total flux gain (in lumens) for inverted truncated pyramid LEDs ($\beta=35.$degree.) divided by the area-ratio of the top extent of the device relative to the active area. This area-ratio is inversely proportional to the number of devices available per wafer and is thus directly proportional to the cost of manufacture of the LED die. Thus, the y-axis is essentially the ratio of total flux gain vs. die-cost relative to counterpart conventional devices (vertical sidewalls) all driven at the same current density of 107.7 A/cm$^2$. The x-axis is the geometric aspect ratio (top-window height divided by active region width) of the pyramid LEDs. FIG. 8 illustrates the general trend of reduced flux per monetary unit (MU) as the aspect ratio of the device increases. For a fixed active region width, the trend suggests that a thinner top window will provide a more favorable situation in terms of flux per MU. The top window must be thick enough to meet the extraction efficiency requirements of the application. For example, for the conventional device, the flux/cost ratio is 1.0. But there is no gain in extraction efficiency for the conventional device. Also, the die-cost increase has been exaggerated because kerf loss associated with manufacture of the conventional LEDs has been neglected. Furthermore, since the die-cost is only a fraction of the cost of a finished LED lamp, the flux per MU situation is in fact much better (in terms of numbers) than illustrated in FIG. 8 for the shaped LEDs. Proper device design must achieve the appropriate balance between flux per MU and minimum required extraction efficiency which varies from application to application.

Figure 9:
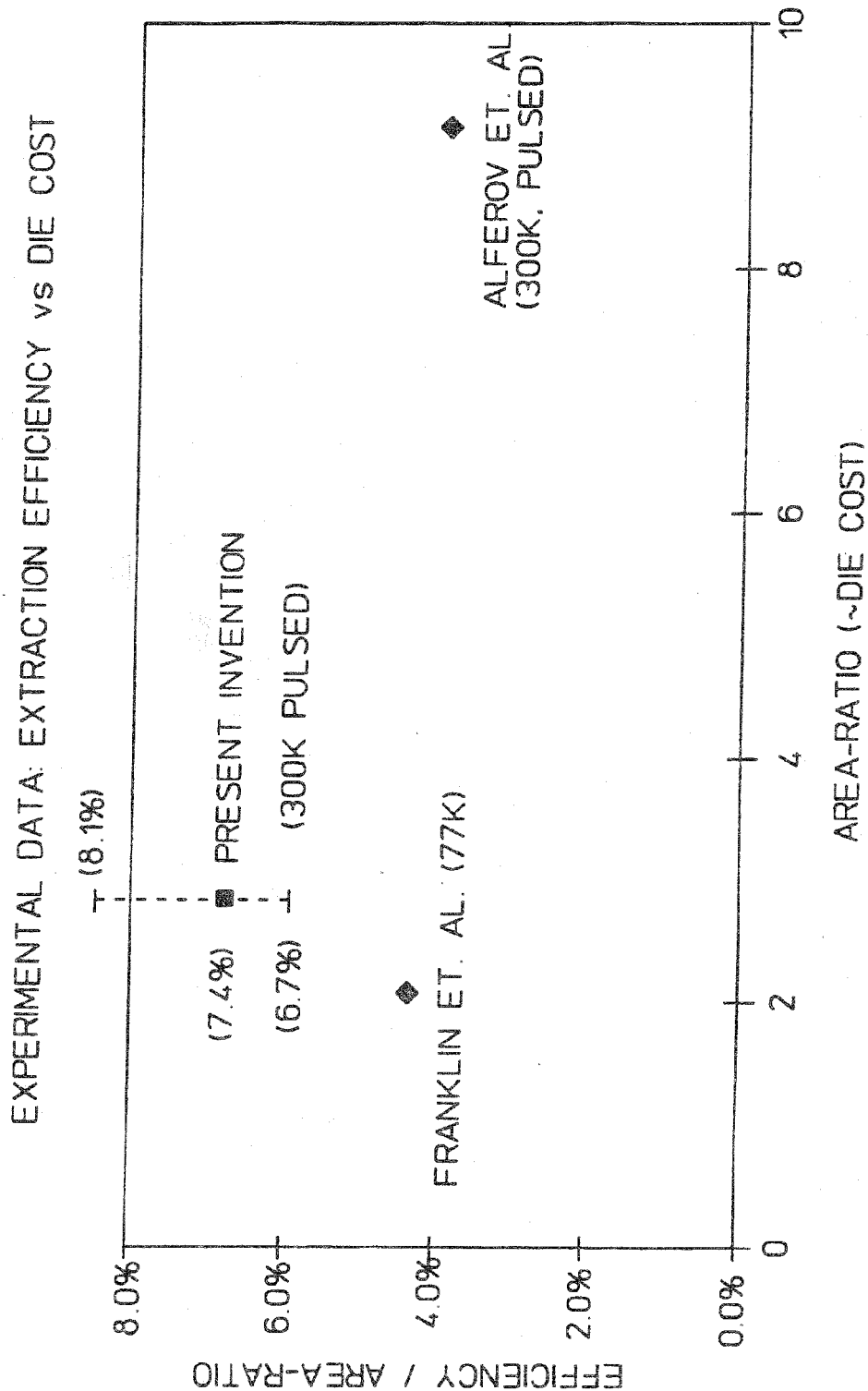
FIG. 9 illustrates advantages in a preferred embodiment over the prior art.

FIG. 9 illustrates an improvement of the present invention over the prior art. The x-axis is area-ratio of the top-surface extent of a device relative to the active area (~die-cost). The y-axis is extraction-efficiency divided the area-ratio, and is essentially a measure of the cost of light-output efficiency in a device (lumen per amp per MU). The two diamond-shaped points are from the prior art and are plotted using measured external quantum efficiencies (in air) as the numbers for extraction efficiency (i.e. assuming 100% internal quantum efficiency, which is reasonable for these devices and testing conditions). The third data point (square and error bars) in FIG. 9 corresponds to the present invention and is for an inverted truncated-pyramid LED ($\beta=35°$, $h_T=8.5$ mils, AlInGaP LED at 636 nm). Since the internal quantum efficiency of the AlInGaP LED is less than 100% (as is known in the art), the extraction efficiency is estimated from experimental light output gains over conventional (rectangular parallelipiped) AlInGaP LEDs from the same material. In this case, the device has an extraction efficiency in the range of ~18-22% and, by design, an area-ratio <3. Note that this device exhibits an improved relationship between efficiency and cost relative to the devices of the prior art. The device described by Alferov, while exhibiting high external quantum efficiency, would have an excessive die-cost (>9×) based upon the chosen geometry. The device of Franklin et. al. employs an acceptable geometry in term of die-cost but suffers from poor external quantum efficiency due to lack of side-light extraction and poor window transparency. It is clear that device designs within the present teaching result in substantial improvement in the relationship between efficiency and cost and have significant implications for use of LEDs in many applications.

Figure 10:
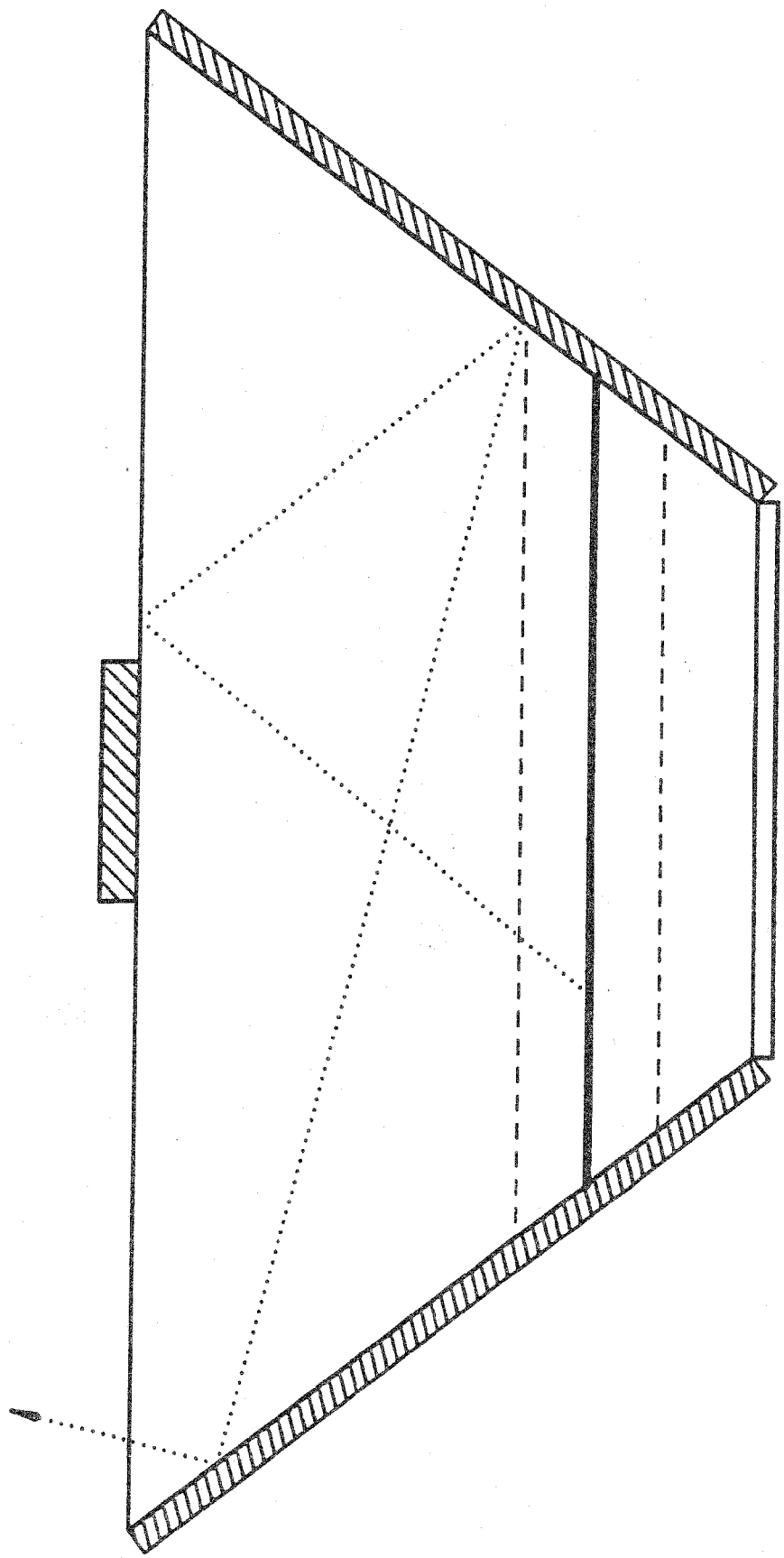
FIG. 10 illustrates a side view of another embodiment.

FIG. 10 depicts a side view of another embodiment. The shaped sidewalls are coated with a highly reflective thin film 30 that may be metallic or dielectric or some combination thereof to inhibit light from escaping out the side-surfaces of the device and promote light exiting through the top surface. The optical design for the packaging scheme is simpler since all light is emitted from a single planar surface. The optical package does not require a highly reflecting mounting surface for the LED because there is no backward-traveling light to be redirected. Furthermore, a portion of the reflective thin film coating may be one of the ohmic electrical contacts to the device to eliminate a wire-bond attachment to a top contact at the device top surface. This reduces reliability problems associated with the wire-bond, removes the wire-bonding step from the manufacturing process, and eliminates top-contact occlusion for light within the device. This contacting scheme may include transparent ITO as an ohmic contact which is subsequently covered with dielectric or metal layers to provide high reflectivity. Alternatively, the shaped side surfaces may be coated with an anti-reflective coating, typically a dielectric (e.g., $SiO_2$, $Si_3N_4$, $Al_2O_3$) thin film or a multi-layer stack of dielectric films as is known in the art or disclosed in the Handbook of Optics, by Driscoll et al. (McGraw-Hill, New York, 1978) sections 8.1-8.124.

Figure 11:
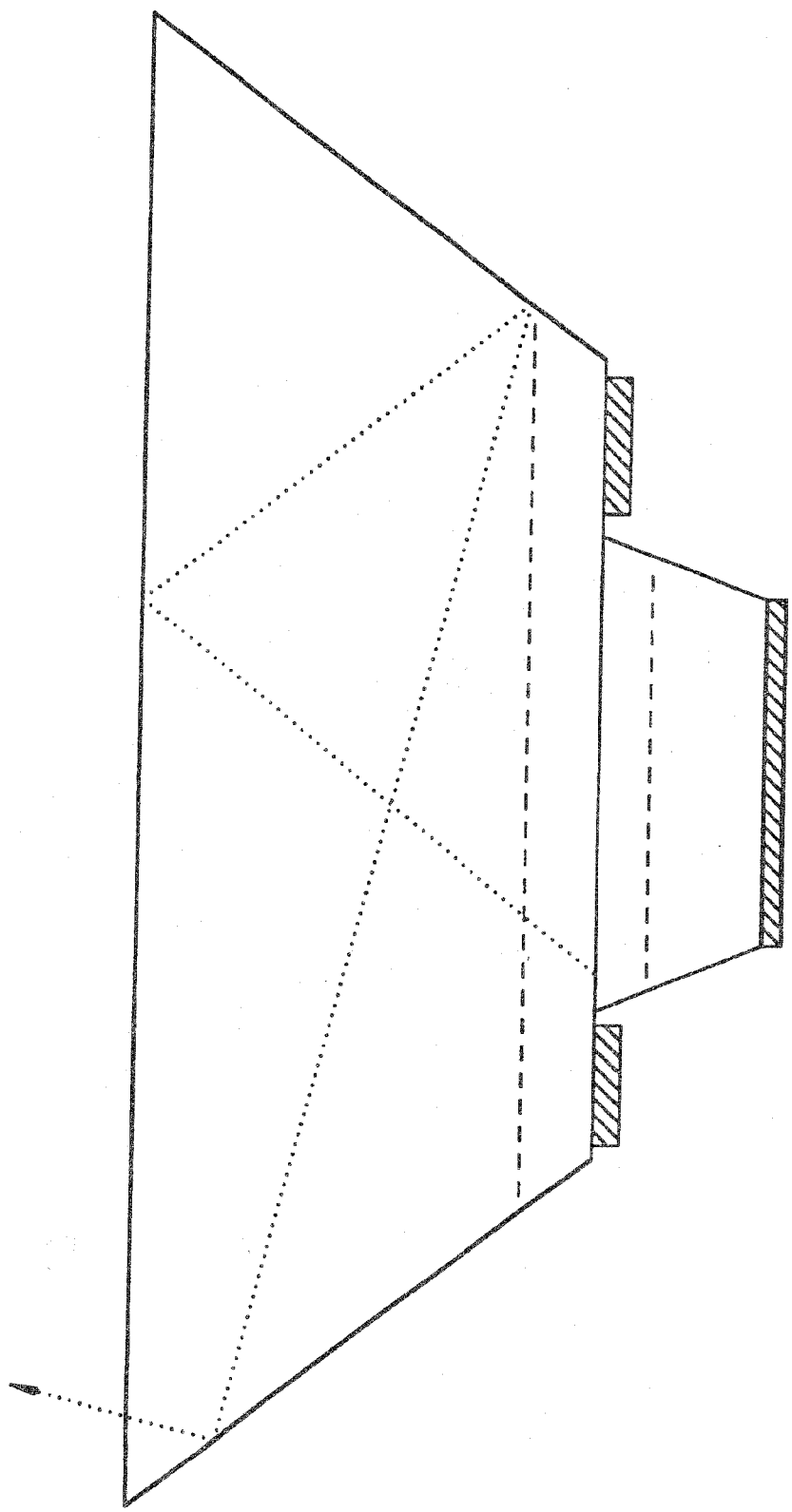
FIG. 11 illustrates an alternate embodiment that has both p and n electrical contacts with the same surface orientation.

FIG. 11 depicts another preferred embodiment, the electrical contacts to both sides of the p-n junction are formed on the bottom mounting surfaces of the device. There is no occlusion from a top contact and no requirement for a wire-bond for forming a current path in the packaged device. The contact geometry and current-spreading is such that reasonably uniform injection into the active layer is achieved. Since no conduction path is required through the top window layer, the top window layer need not be doped. This layer need not be a semiconductor, but may be any transparent material that may be attached to the epitaxial layers to form an optical interface for light extraction from the device active region.

Other embodiments of the present invention provide III-Phosphide and III-Arsenide light-emitting devices with improved light extraction and brightness. These devices may be, for example, light-emitting diodes or laser diodes.

In accordance with one embodiment (FIG. 13), for example, a light-emitting device 100 includes a stack of layers 110 including an active region 112. Active region 112 includes one or more semiconductor layers formed from III-Phosphide or III-Arsenide materials, and may include one or more quantum well layers. The emission wavelengths of light generated in active region 112 may lie, for example, in the visible or infrared regions of the electromagnetic spectrum. The detailed layer structure of active region 112 and the wavelengths of light generated therein are not critical.

Active region 112 is disposed between a first semiconductor region 114 having a first conductivity type and a second semiconductor region 116 having a second conductivity type. Hence, a diode junction is formed in or adjacent to active region 112. Semiconductor regions 114 and 116 may each include one or more semiconductor layers. These semiconductor layers may be undoped or doped either n-type or p-type. In some embodiments, the layers in regions 114 and 116 are formed from III-Phosphide materials, III-Arsenide materials, or from both III-Phosphide and III-Arsenide materials. In other embodiments, the layers in regions 114 and 116 are formed from other semiconductor materials. Semiconductor layers in active region 112 and in regions 114 and 116 may form, for example, a double heterostructure, a single heterostructure, or a homojunction. The detailed layer structure of semiconductor regions 114 and 116 is not critical.

Light-emitting device 100 also includes superstrate 117 disposed on a top side of stack 110 and substantially transparent to light emitted by active region 112. The term "substantially transparent" is used herein to indicate that an optical element so described, such as a substantially transparent superstrate, transmits light at the emission wavelengths of active region 112 with less than about 50%, preferably less than about 20%, single pass loss due to absorption or scattering. One of ordinary skill in the art will recognize that the conditions "less than about 50% loss" and "less than about 20% loss" may be met by various combinations of transmission path length and absorption coefficient.

Figure 13:
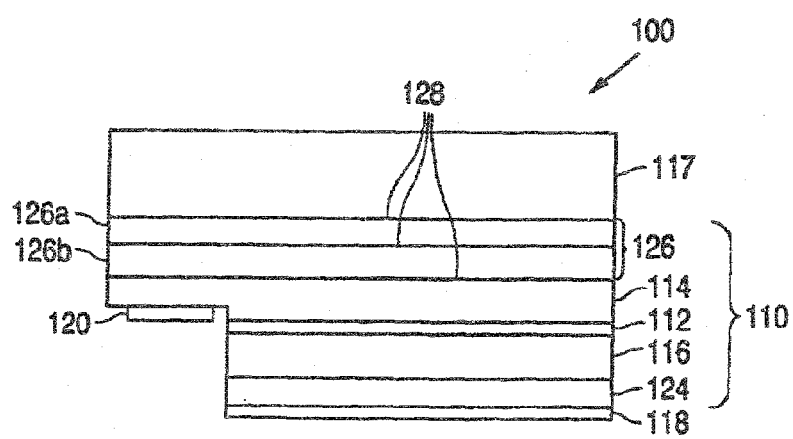
FIGS. 13 and 14 schematically illustrate a light-emitting device in accordance with one embodiment.

In the embodiment illustrated in FIG. 13, superstrate 117 has no electrical function. Consequently, the choices for materials from which superstrate 117 may be formed are much less limited than for conventional vertical geometry devices. For example, in the embodiment illustrated in FIG. 13 superstrate 117 may be formed from a substantially non-conducting or highly resistive material. In one implementation, for example, superstrate 117 has a resistivity greater than about 0.05 Ohm-centimeters.

Superstrate 117 may be formed, for example, from suitably transparent semiconductors or dielectric materials. Semiconductors which may be suitable include but are not limited to III-Phosphides (GaP, for example), III-Arsenides (AlGaAs, for example), III-Nitrides (GaN, for example), II-VI semiconductors (ZnS, ZnSe, CdSe, CdTe, for example), SiC, germanium, silicon, and alloys thereof. Dielectric materials which may be suitable include, but are not limited to, diamond, yttrium aluminum garnet (YAG), metal oxides, metal fluorides, optical glasses, and chalcogenide glasses. Other phosphides, arsenides, and nitrides, whether dielectric or semiconducting, may also be suitable for superstrate 117. Example metal oxides which may be suitable include but are not limited to aluminum oxide (sapphire), tungsten oxide, tellurium oxide, titanium oxide, nickel oxide, zirconium oxide (cubic zirconia), indium tin oxide, tin oxide, barium oxide, strontium oxide, calcium oxide, zinc oxide, gallium oxide, antimony oxide, molybdenum oxide, chromium oxide, lead oxide, and bismuth oxide. Example metal fluorides which may be suitable include magnesium fluoride and calcium fluoride. Example optical glasses which may be suitable include but are not limited to Schott glasses SF57, SF59, SFL56, LaSF3, LaSFN9, LaSFN18, and LaSFN30 and Ohara glass PBH71. Example chalcogenide glasses which may be suitable include but are not limited to (Ge,Sb,Ga)(S,Se) glasses.

Since superstrate 117 may be substantially non-conducting or highly resistive, it may be formed from an undoped semiconductor that exhibits little or no free carrier absorption. In one embodiment, for example, superstrate 117 is formed from undoped GaP. The term "undoped" is used herein to indicate that no dopants have been intentionally added to the semiconductor material.

A severe mismatch between the thermal expansion coefficients of superstrate 117 and of stack 110 may cause superstrate 117 to detach from stack 110 upon heating or cooling. Also, approximately matching thermal expansion coefficients reduces the stress induced in stack 110 by superstrate 117. Hence, in some implementations superstrate 117 is formed from a material selected to have a thermal expansion coefficient approximately matching the thermal expansion coefficient of the materials in stack 110. Borosilicate glasses, for example, may be formulated to have coefficients of thermal expansion approximately matching those of III-V semiconductor compounds and hence may be suitable materials for superstrate 117.

The presence of superstrate 117 improves the efficiency with which light is extracted from light emitting device 100 by reducing the fraction of light emitted by active region 112 which is trapped in light-emitting device 100 by total internal reflection at interfaces with the surrounding environment. Both the refractive index and the thickness of superstrate 117 affect this light extraction efficiency. Forming superstrate 117 from a high refractive index material to more closely match the index of stack 110 typically increases the efficiency with which light emitted by active region 112 is coupled from stack 110 into superstrate 117. Consequently, in some implementations superstrate 117 is formed from a material selected to have a refractive index greater than about 1.5, preferably greater than about 1.8, at wavelengths of light emitted by active region 112. In other implementations superstrate 117 may have a refractive index which grades from a high value (greater than about 1.5, preferable greater than about 1.8, for example) near stack 110 to a lower value away from stack 110. In addition, the range of emission angles for which light emitted by active region 112 escapes from light-emitting device 100 increases as superstrate 117 is made thicker. Consequently, superstrate 117 typically has a thickness of, for example, about 25 microns (μm) to about 1000 μm. As described below, a relatively thick superstrate also allows the light-emitting device to be shaped to further improve its light extraction efficiency.

Superstrate 117 also provides mechanical strength and stability which allow light-emitting device 100 to be, in some embodiments, a large area device providing a high output flux. In addition, superstrate 117 functions as a heat spreader which smooths the temperature profile in stack 110 and thereby allows light-emitting device 100 to be operated at higher power.

Light-emitting device 100 also includes electrical contacts 118 and 120 configured to apply a voltage across active region 112. Contacts 118 and 120, which are electrically connected to regions of opposite conductivity type in stack 110, are disposed on a bottom side of stack 110 opposite to the (top) side of stack 110 on which superstrate 117 is disposed. Though contacts 118 and 120 are disposed on the same side of stack 110, they are not necessarily (though may be) located at the same height in stack 110 or disposed on the same layer. Layers may be etched away or holes, trenches, or vias may be used to connect one of the contacts.

Figure 14:
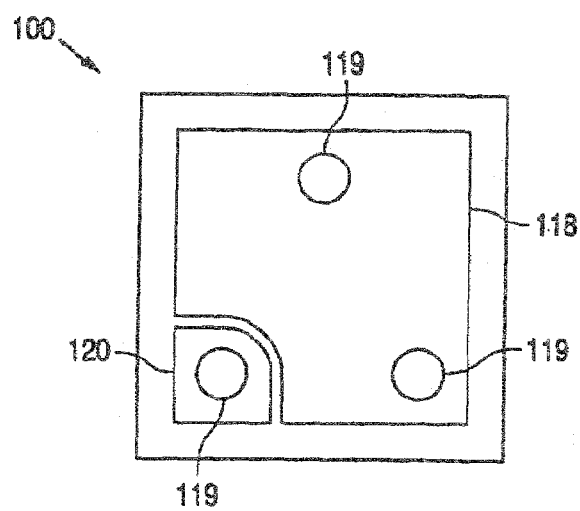

Contacts 118 and 120 may each include multiple layers of conducting material and may be formed, for example, from gold, silver, nickel, aluminum, titanium, chromium, platinum, palladium, rhodium, rhenium, tungsten, tin, germanium, beryllium, zinc, and alloys thereof. FIG. 14 shows a plan view of electrical contacts 118 and 120 in accordance with one embodiment. In one implementation, solderable metal pads 119 are disposed on contacts 118 and 120 to facilitate electrical connection to contacts 118 and 120 with solder bumps, for example.

In some embodiments contact 118 is disposed directly on semiconductor region 116, and optional layer 124 shown in FIG. 13, for example, is not present. In other embodiments contact 118 is spaced apart from semiconductor region 116 by one or more additional layers such as layer 124.

In some embodiments, contact 118 is highly reflective to light emitted by active region 112 and consequently reflects such light incident on it from active region 112 back toward substantially transparent superstrate 117. The term "highly reflective" is used herein to indicate a reflectivity greater than about 50%, preferably greater than about 75%, for light emitted by active region 112. Suitable reflective contacts are disclosed in or substantially similar to contacts disclosed in, for example, U.S. Pat. Nos. 5,917,202, 6,222,207, and 6,287,947, all of which are incorporated herein by reference in their entirety. Suitable reflective contacts are also disclosed in U.S. patent application Ser. No. 09/469,652, assigned to the assignee of the present invention and incorporated herein by reference in its entirety.

Figure 15:
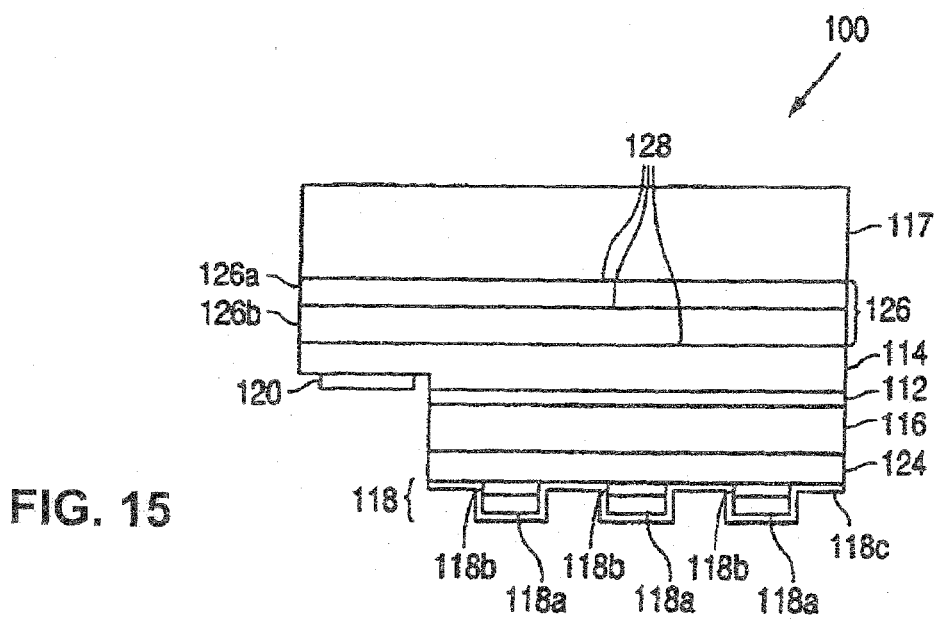
FIGS. 15, 16, and 17 schematically illustrate light-emitting devices in accordance with other embodiments.

Ohmic contact between a reflective metal layer and a III-Phosphide or III-Arsenide layer having a high aluminum content, such as a cladding layer, may be difficult to achieve because of the easy formation of aluminum oxides, which tend to insulate the contact. A reflective contact 118 which may be particularly advantageous in such cases is shown in FIG. 15. In the embodiment illustrated in FIG. 15, contact 118 includes a plurality of ohmic contacts 118a disposed on a patterned semiconductor layer 118b. A reflective metal layer 118c is disposed on ohmic contacts 118a and on portions of layer 124 not covered by patterned semiconductor layer 118b. In one implementation, patterned semiconductor layer 118b is formed from GaAs, GaInP or very low Al-content AlGaInP, ohmic contacts 118a are formed from gold and germanium or gold and zinc, and reflective metal layer 118c is formed from gold, aluminum, or silver. The GaInP or low Al-content AlGaInP patterned semiconductor layer makes good electrical contact with layer 124 even if layer 124 has a high aluminum content.

The geometry of the pattern of semiconductor layer 118b (and hence of ohmic contacts 118a) depends upon the requirements for current spreading and optical transparency. Since the material in patterned semiconductor layer 118b may absorb light emitted by active region 112, layer 118b should be thin and the surface area of layer 124 covered by layer 118b should be relatively small.

Layer 124 (FIGS. 13 and 15) may be, for example, a portion of a sacrificial semiconductor substrate used in a method, described below, for fabricating light-emitting device 100. Alternatively, layer 124 may be a layer grown, deposited, or bonded to semiconductor region 116. In embodiments in which region 116 is of p-type conductivity, layer 124 may be, for example, a p-type semiconductor current spreading layer. In other embodiments, layer 124 may be a layer of a material (e.g., a metal) that is highly reflective to light emitted by active region 112. Also, layer 124 may form part of a conventional distributed Bragg reflector disposed between active region 112 and contact 118 to reflect a portion of light emitted by active region 112 toward substantially transparent superstrate 117. Layer 124, if present, may also provide mechanical strength and support for stack 110 during fabrication (bonding or wafer bonding, for example) of light-emitting device 100.

In some embodiments, superstrate 117 is attached to stack 110 with a bonding process during a fabrication method described below. In such embodiments, stack 110 may include one or more optional bonding layers 126 (e.g., 126a and 126b of FIGS. 13 and 15, for example) disposed between region 114 and superstrate 117. Superstrate 117 may be bonded to one of layers 126 (e.g., 126a), one of layers 126 may be bonded to another one of layers 126, or one of layers 126 (e.g., 126b) may be bonded to semiconductor region 114. One of ordinary skill in the art will recognize that a bonding process (such as a wafer bonding process, for example) may form a bonded interface characterized, for example, by material transfer between bonded layers or, for example, by the formation of a strong bond between lattice-mismatched layers without the formation of lattice defects in the layers characteristic of a lattice-mismatched growth process. Any one of interfaces 128 shown in FIG. 13, for example, may be such a bonded interface. Alternatively, bonding layers 126 may be absent and superstrate 117 may be bonded directly to semiconductor region 114. In the latter case, an interface between superstrate 117 and semiconductor region 114 may be such a bonded interface.

Bonding layers 126 may be formed, for example, from materials chosen to provide a mechanically strong bond and a good optical interface between stack 110 and superstrate 117. Typically, bonding layers 126 are selected to be substantially transparent to light emitted by active region 112. In some implementations, the materials from which layers 126 are formed are selected to have refractive indices greater than about 1.5, preferably greater than about 1.8, at wavelengths of light emitted by active region 112. Also, in some implementations layers 126 have a total thickness less than about 500 Angstroms (Å), preferably less than about 100 Å. Making layers 126 thin and/or forming them from high refractive index materials may reduce optical losses resulting from total internal reflection of light emitted by active region 112 at, for example interfaces 128.

In the embodiment illustrated in FIG. 13, for example, bonding layers 126 have no electrical function. Consequently, in such embodiments bonding layers 126 and interfaces 128 need not exhibit good electrical conduction and may be highly resistive. Bonding layers 126 may be formed, for example, from suitably transparent semiconductors or dielectric materials. Example semiconductor and dielectric materials which may be suitable for bonding layers 126 include but are not limited to those materials listed above for superstrate 117. Since bonding layers 126 need not be electrically conductive, in some embodiments they may be formed from undoped semiconductor materials that exhibit little or no free carrier absorption. Additional materials which may be suitable for bonding layers 126 include but are not limited to high refractive index organic compounds, organic semiconductors, and metals such as, for example, zinc, indium, magnesium, and tin.

In some embodiments semiconductor region 114 may be absent and superstrate 117 may be conductive (with a conductivity type different from region 116) and may be attached to active region 112 by bonding, for example, either directly or with bonding layers 126. In such cases, contact 120 may be disposed, for example, directly on superstrate 117 and bonding layers 126, if present, would also be conductive. In these embodiments superstrate 117 (and bonding layers 126, if present) would form part of a path through which current flows during operation of light-emitting device 100.

Referring again to the embodiments illustrated in FIGS. 13 and 14, for example, application of a suitable forward bias across contacts 118 and 120 causes current to flow through semiconductor region 114, active region 112, and semiconductor region 116, and thereby causes active region 112 to emit light. Since contacts 118 and 120 are both disposed on the bottom of stack 110, some of the injected current must flow laterally through semiconductor region 114 if the portion of active region 112 that emits light (and thus the flux provided by device 100) is to be maximized. Such lateral current flow is also necessary in order to provide a spatially uniform current density in active region 112 and thereby provide a desirable spatially uniform light emission intensity. The electrical contact geometry shown in FIGS. 13 and 14 works well for devices having relatively small area (<about 0.2 mm$^2$, for example) active regions. One of ordinary skill in the art would recognize, however, that it can be difficult to achieve such lateral current spreading across large areas, particularly in p-type semiconductor layers. P-type III-Phosphide layers, for example, typically have a high resistivity that limits lateral current flow. Moreover, lateral current spreading generally becomes more difficult with increasing average current density and thus may be difficult for high flux devices.

Figure 12:
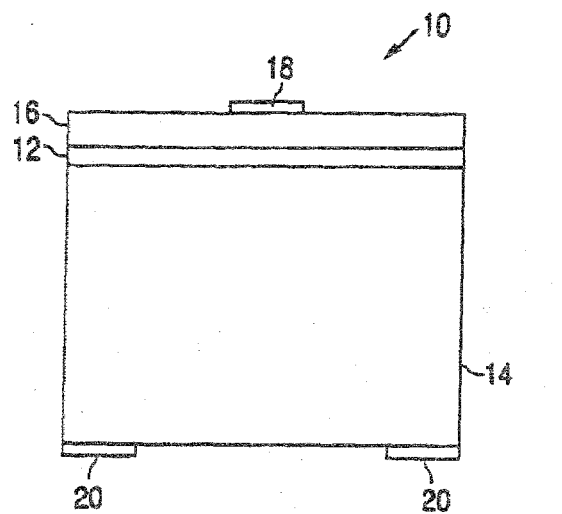
FIG. 12 schematically illustrates a prior art light-emitting-device.

In conventional vertical geometry light-emitting devices such as device 10 (FIG. 12), lateral spreading of current injected into p-type layer 16 through p-contact 18 is typically enhanced by making layer 16 sufficiently thick. Such a current spreading layer in a conventional vertical geometry device may be, for example, greater than 5 μm thick. One of ordinary skill in the art would recognize, however, that insertion of such a thick current spreading layer into light-emitting device 100 may make etching steps required during fabrication of light-emitting device 100 difficult, and would be disinclined to insert such a layer. Consequently, one of ordinary skill in the art might expect lateral current spreading to be a problem for a large active area (>about 0.2 mm$^2$, for example) light-emitting device.

The inventors have recognized, however, that sufficient lateral current spreading in a large active area light-emitting device may be provided, for example, by suitably designed contacts 118 and 120. Contact designs that may provide sufficient lateral current spreading in a large active area light-emitting device are disclosed, for example, in U.S. Pat. No. 6,486,499, U.S. Pat. No. 6,547,249, and in U.S. Pat. No. 6,307,218, all of which are incorporated herein by reference in their entirety.

Figure 16:
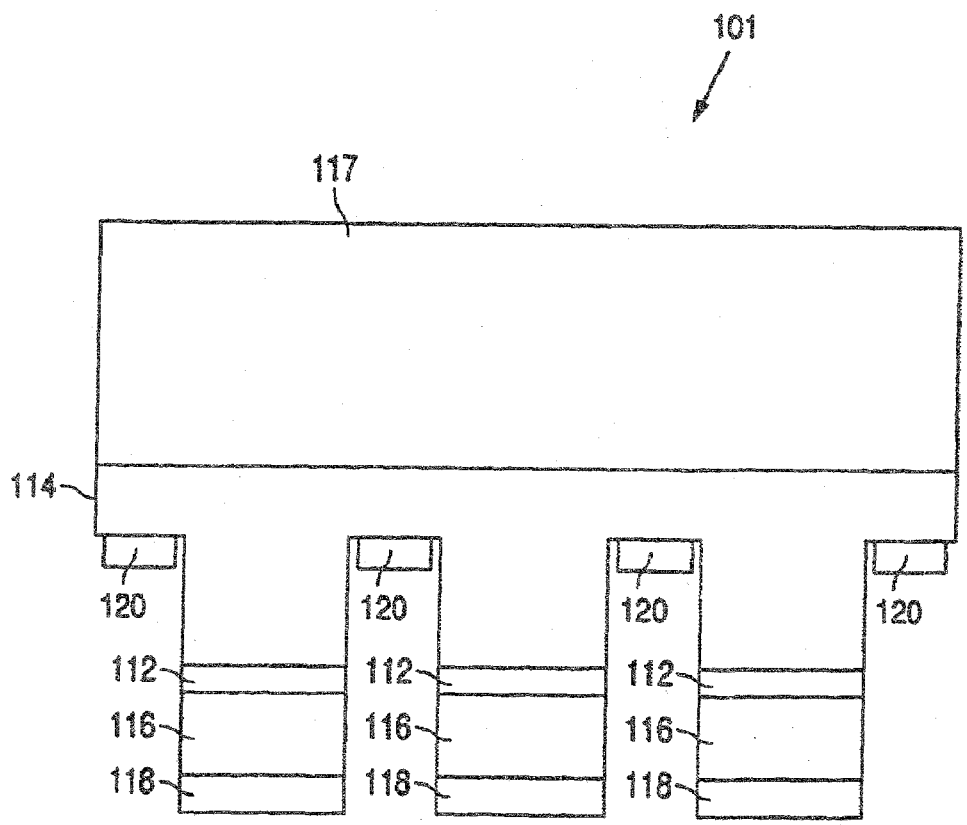
Figure 17:
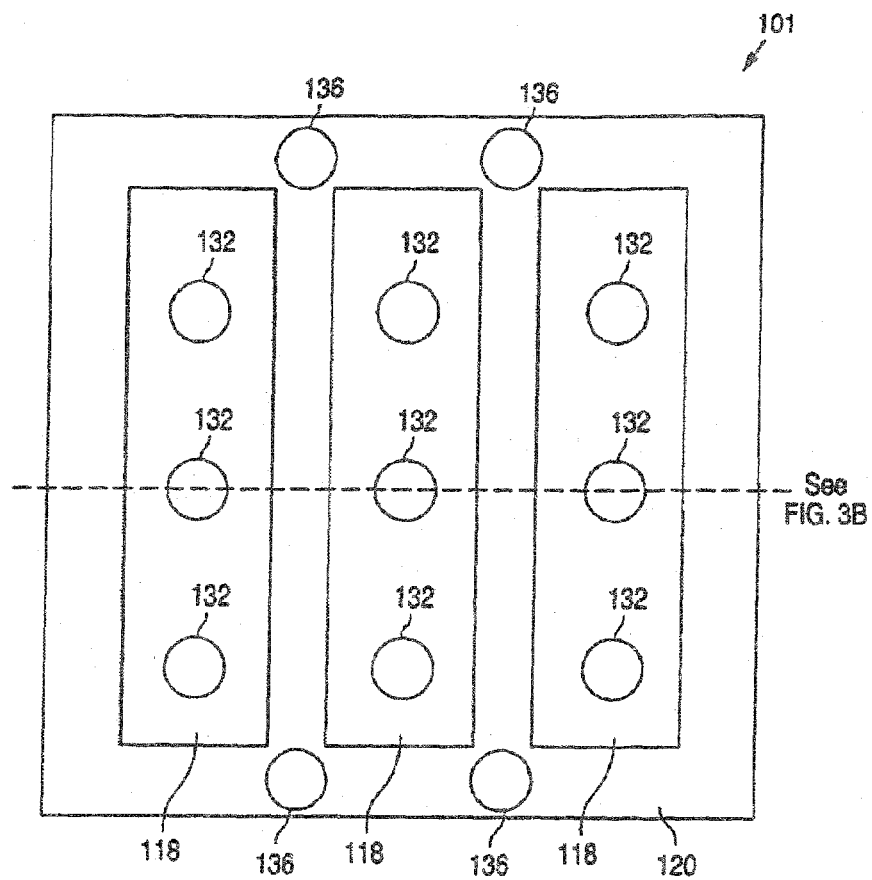

An example contact design that provides enhanced current spreading is implemented in light-emitting device 101 shown in FIG. 16 (cross-sectional view) and in FIG. 17 (plan view). In this embodiment, a plurality of regions 116 of one conductivity type are isolated from each other by a single continuous region 114 of another conductivity type. Contacts 118, each disposed on a separate one of regions 116, are similarly isolated from each other. Continuous contact 120 disposed on region 114 surrounds contacts 118. Contacts 118 and contact 120 may be reflective to light emitted by active regions 112. As discussed below with respect to FIG. 18, solder bumps 132 and 136 shown in FIG. 17 may electrically connect, respectively, contacts 118 and contact 120 to separate electrical contacts or conductive traces on a submount or substrate. Light-emitting device 101 may be viewed as a monolithic array of LED or LD structures electrically coupled in parallel by contact 120. The contact geometry shown in FIGS. 16 and 17 works well for light-emitting devices having active areas greater than about 0.2 mm$^2$.

Figure 18:
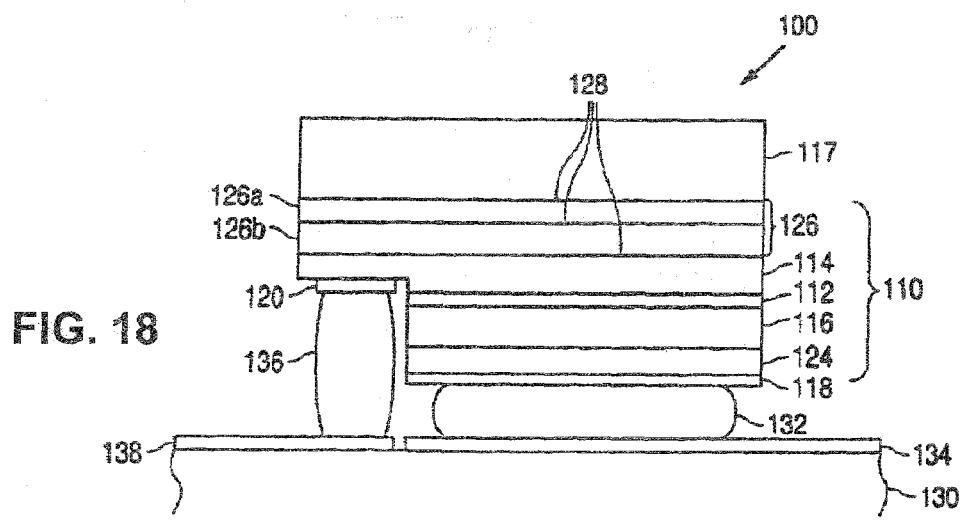
FIG. 18 schematically illustrates a light-emitting device attached to a submount in accordance with another embodiment.

Since contacts 118 and 120 (FIGS. 13, 14, 15, 16, and 17) are both disposed on the bottom of stack 110, in embodiments in which contacts 118 and 120 are opaque (e.g., reflective), a larger fraction of light emitted by active region 112 exits the stack through its top side into superstrate 117 than through its bottom side. Consequently, light-emitting devices 100 and 101 may be advantageously attached as a flip chip to a submount, for example. Referring to FIG. 18, for example, in one embodiment light-emitting device 100 is attached to a submount 130 and oriented with superstrate 117 facing away from submount 130 and contacts 118 and 120 facing toward submount 130. Solder connection 132 electrically couples contact 118 to contact 134 on submount 130. Solder connection 136 similarly electrically couples contact 120 to contact 138 on submount 130. In this embodiment, light emitted by active region 112 typically exits light emitting device 100 primarily through superstrate 117. Solder connections 132 and 136 may be formed, for example, with conventional solders or other conductive adhesives. Submount 130 may optionally include additional circuitry such as, for example, circuitry to protect light-emitting device 100 from electrostatic discharges or a photodiode for feedback on LED power output. Suitable circuitry is disclosed, for example, in U.S. Pat. No. 6,885,035 assigned to the assignee of the present invention and incorporated herein by reference in its entirety.

The III-Phosphide and III-Arsenide light-emitting devices disclosed herein may provide numerous advantages in comparison to conventional III-Phosphide and III-Arsenide light-emitting devices, including for high power applications. Superstrate 117 of light-emitting device 100 may be more transparent than substrate 14 of conventional light-emitting device 10 (FIG. 12), for example, since superstrate 117 need not be electrically conductive. This allows the use of higher bandgap semiconductor or dielectric materials which, in addition, need not be doped and thus may exhibit little or no free carrier absorption. In addition, the optical properties of any bonded interfaces in light-emitting device 100 may be optimized, since such interfaces need not be electrically conductive as required in conventional light-emitting device 10. Moreover, in contrast to conventional light-emitting device 10, contacts 118 and 120 are both disposed on the bottom of light-emitting device 100 and thus do not block light emitted by active region 112 from exiting device 100 through superstrate 117. As a consequence of these optical improvements, light may be extracted more efficiently from the light-emitting devices disclosed herein in than from conventional vertical geometry III-Phosphide and III-Arsenide light-emitting devices.

The flip-chip geometry (FIG. 18) in which the disclosed light-emitting devices may be mounted also provides advantages. In particular, the absence of wire bonds and the close proximity of the active region to a submount, for example, (which may act as a heat sink) may allow the disclosed light-emitting devices to operate at higher input powers and with larger area active regions than is practical with conventional III-Phosphide and III-Arsenide light-emitting devices. In some embodiments, for example, the area of active region 112 exceeds 0.2 square millimeters (mm$^2$), 1.0 mm$^2$, or 4.0 mm$^2$, and the electrical power input to the devices exceeds, respectively, 0.1 Watt (W), 0.5 W, or 2.0 W. The electrical power input to the devices may be further increased for larger active area devices. Consequently, the disclosed light-emitting devices may provide higher flux than conventional III-Phosphide and III-Arsenide light-emitting devices.

Figure 19:
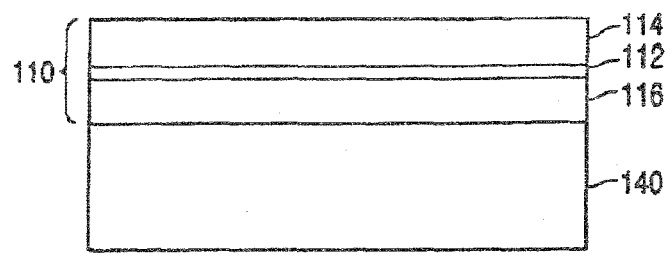
FIGS. 19, 20, 21, and 22 schematically illustrate a method of fabricating a light-emitting device in accordance with one embodiment.
Figure 20:
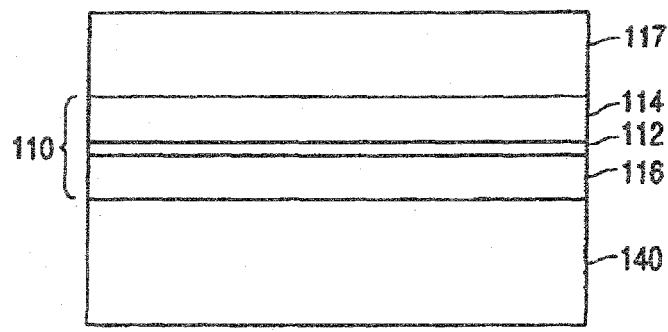
Figure 21:
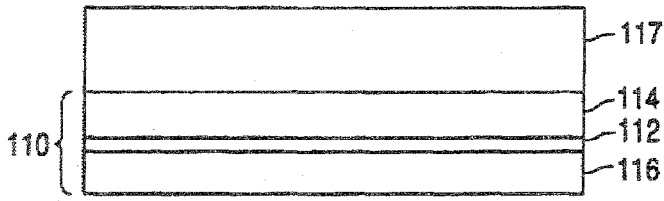

Light-emitting devices such as those disclosed above may be fabricated, for example, by a method illustrated in FIGS. 19, 20, 21, and 22. Referring to FIG. 19, stack 110 including semiconductor region 114 of a first conductivity type, active region 112, and semiconductor region 116 of a second conductivity type may be grown on a sacrificial host substrate 140 by conventional deposition techniques including but not limited to metal-organic chemical vapor deposition (MOCVD), molecular beam epitaxy (MBE), vapor phase epitaxy (VPE), and liquid phase epitaxy (LPE). Additional layers such as layer 124 and bonding layers 126 shown in FIGS. 13 and 15 may also be formed at this time. Host substrate 140 is typically chosen to provide a lattice matched substrate for the semiconductor layers grown above it. In some embodiments, host substrate 140 is formed from GaAs.

Next (FIG. 20), superstrate 117 may be attached to stack 110 opposite to host substrate 140 by bonding, for example. In one embodiment, superstrate 117 is bonded to stack 110 by placing superstrate 117 in contact with stack 110, raising the temperature of superstrate 117 and stack 110, and pressing superstrate 117 and stack 110 together. This bonding process may be performed, for example, with a conventional vertical press or with devices disclosed in U.S. Pat. Nos. 5,502,316 and 5,376,580, incorporated herein by reference in their entirety. In some implementations, one or more bonding layers (e.g., layer 126a in FIG. 13) are formed on superstrate 117 before the bonding process is performed. Preferably, the temperature of stack 110 and superstrate 117 is raised to a temperature less than about 1000° C. in order to avoid damaging active region 112 and regions 114 and 116. In some embodiments the bonding process may be performed at advantageously low temperatures, since the resulting bonded interface need not be electrically conducting.

In some embodiments, superstrate 117 is grown on stack 110 using conventional deposition techniques such as, for example, MOCVD, VPE, and LPE. In one embodiment, for example, active region 112 includes a light-emitting layer formed from a III-Arsenide material, and superstrate 117 is formed from an AlGaAs alloy grown on stack 110. In such embodiments, the light-emitting device need not include a bonded interface. In embodiments in which superstrate 117 is grown, an optional composition graded layer may be grown on stack 110 (before the growth of superstrate 117) to enable lattice-matched growth of superstrate 117 despite a lattice mismatch between superstrate 117 and stack 110. The composition of the graded layer varies such that the layer is substantially lattice matched to both stack 110 and superstrate 117. Such a composition graded layer may take the place of bonding layers 126 of FIG. 13, for example, and is typically selected to be substantially transparent to light emitted by active region 112.

Figure 22:
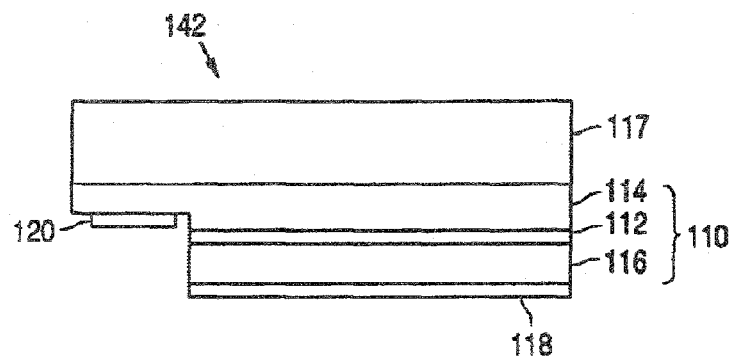

After superstrate 117 has been attached to stack 110, some or all of sacrificial host substrate 140 may be removed (FIG. 21) by conventional techniques including but not limited to chemical etching, lapping/polishing, reactive ion etching, and ion milling. The method of removing sacrificial host substrate 140 is not critical. Conventional photolithographic, etching, and deposition techniques may then be used to form contacts 118 and 120 to complete light-emitting device 142 (FIG. 22).

Figure 23:
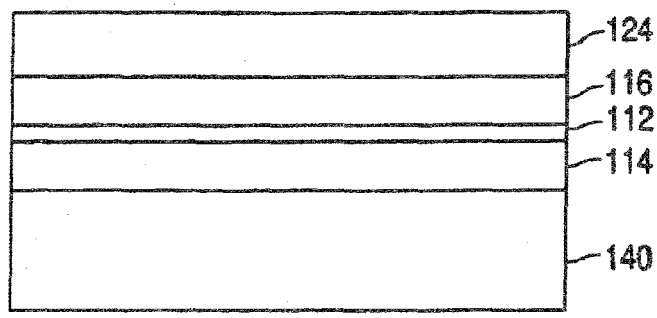
FIGS. 23, 24, 25, and 26 schematically illustrate another method of fabricating a light-emitting device in accordance with another embodiment.
Figure 24:
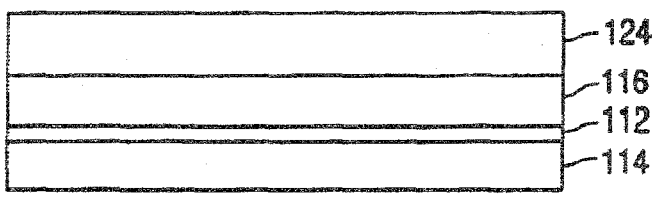
Figure 25:
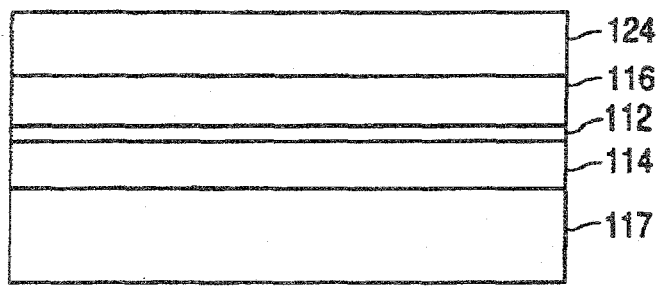
Figure 26:
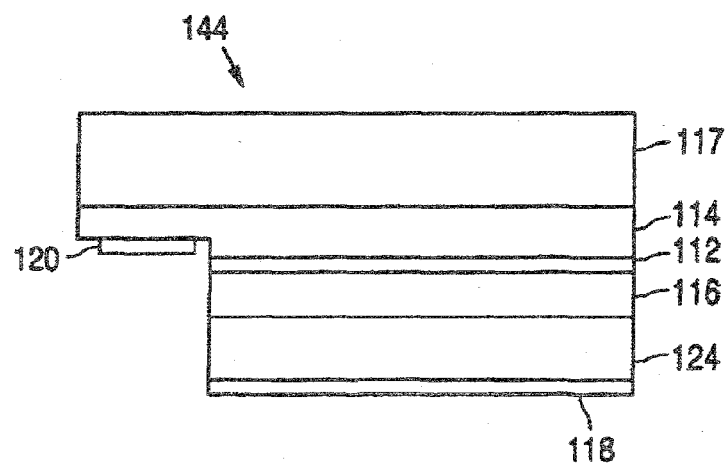

In the method just described, sacrificial substrate 140 is removed after superstrate 117 is attached to stack 110. In a method illustrated in FIGS. 23, 24, 25, and 26, sacrificial substrate 140 is removed before superstrate 117 is attached. Referring to FIG. 23, as in the previous method active region 112 and regions 114 and 116 are formed on sacrificial substrate 140. Additional layer 124 may also be formed at this time. Sacrificial substrate 140 may then be removed (FIG. 24) and superstrate 117 (FIG. 25) may be attached by bonding or grown by conventional deposition techniques as described above (including techniques utilizing graded composition lattice-matching layers). Although in FIGS. 25 and 26 superstrate 117 is shown attached to semiconductor region 114, in other embodiments superstrate 117 may be attached instead to layer 124. Layer 124 may provide mechanical support for stack 110 during the removal of substrate 140 and during attachment of superstrate 117. Conventional photolithographic, etching, and deposition techniques may then be used to form contacts 118 and 120 to complete light-emitting device 144 (FIG. 26).

In another method of fabricating light-emitting devices such as those disclosed above, stack 110 is grown on superstrate 117 rather than on host substrate 140. An optional composition graded layer may be grown on superstrate 117 (before the growth of stack 110) to enable lattice-matched or nearly lattice-matched growth of stack 110 despite a lattice mismatch between superstrate 117 and stack 110. The composition graded layer, which is typically selected to be substantially transparent to light emitted by active region 112, may take the place of bonding layers 126 of FIG. 13, for example. In one embodiment, for example, a graded composition AlGaInP layer is grown on a substantially transparent superstrate formed from GaP. A stack of layers including a III-Phosphide based active region is subsequently grown on the graded composition layer. The composition of the graded layer varies such that the layer is substantially lattice-matched to both the superstrate and the stack of layers. This method does not require the use of a sacrificial host substrate.

FIGS. 19, 20, 21, and 22 show superstrate 117 grown on or bonded to a stack 110 in an individual device. One of ordinary skill in the art will recognize, however, that attachment of superstrate 117 to stack 110 may occur at the device level (after dicing) or at the wafer level (before dicing), depending on the manufacturing flow.

Referring again to FIGS. 13 and 15, for example, superstrate 117 and layers in stack 110 may be formed from materials having a relatively high index of refraction. In such embodiments, some of the light emitted by active region 112 may be trapped in light-emitting device 100 by total internal reflection at interfaces between, for example, superstrate 117 and air or between superstrate 117 and a low refractive index material (not shown) encapsulating light-emitting device 100.

Figure 27:
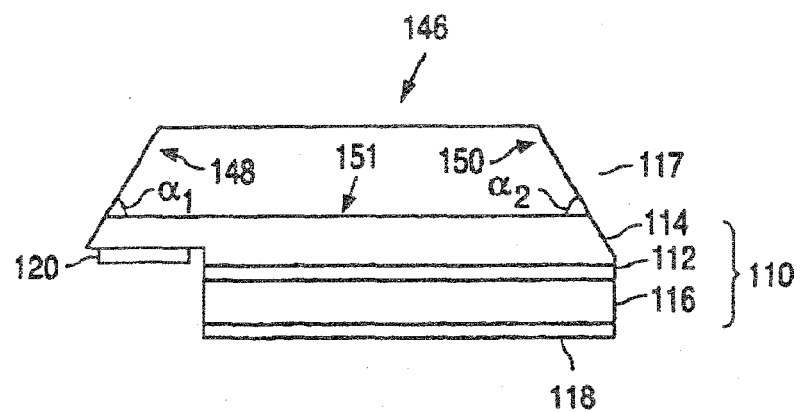
FIGS. 27, 28, 29, 30, 31, and 32 schematically illustrate embodiments in which superstrates are shaped or interfaces are textured to increase light extraction efficiency.
Figure 28:
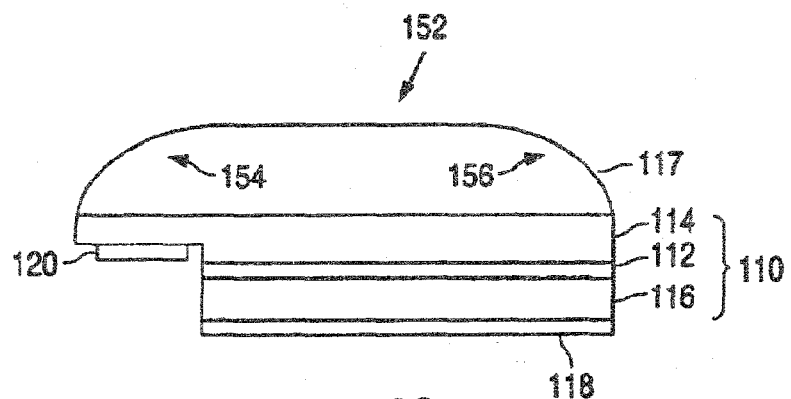

In some embodiments, portions of the light-emitting device are shaped to reduce trapping of light by total internal reflection. In the embodiment illustrated in FIG. 27, for example, light-emitting device 146 includes superstrate 117 having surfaces 148 and 150 which form acute angles $\alpha_1$ and $\alpha_2$ with a top surface 151 of stack 110. Such angled surfaces may be formed, for example, by dicing a wafer into separate devices with a beveled or angled saw blade. Similarly, in another embodiment (FIG. 28) light-emitting device 152 includes a superstrate 117 having curved surfaces 154 and 156. These surfaces may also be formed, for example, by dicing with an appropriately shaped saw blade, or by etching or milling or by a combination of such techniques. The shapes of the superstrates in light-emitting devices 146 and 152 may approximate the shape of, for example, a dome or a hemisphere. Hence, in these embodiments more of the light emitted by active region 112 is incident on interfaces between the superstrate and the external environment at angles close to normal incidence than is the case for a superstrate having a cubic or rectangular prism shape as in FIG. 12. Consequently, light may be extracted more efficiently from light-emitting devices 146 and 152 than from light-emitting device 100 since the fraction of emitted light trapped in devices 146 and 152 by total internal reflection may be reduced compared to that for device 100.

Figure 29:
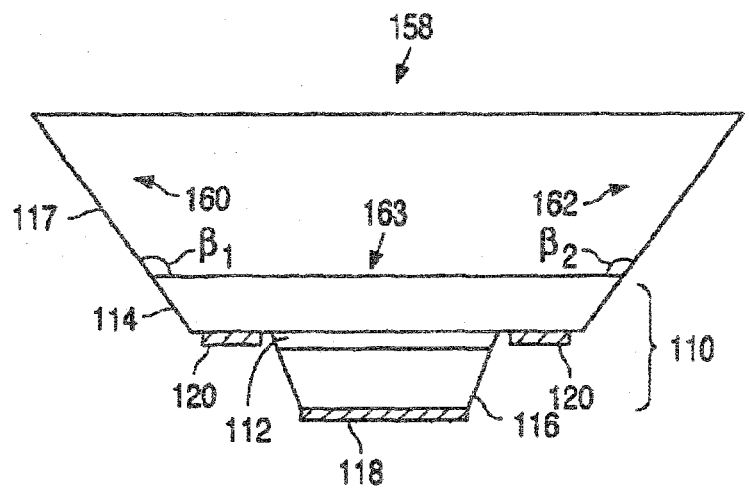

In another embodiment (FIG. 29), light-emitting device 158 includes superstrate 117 having surfaces 160 and 162 which form obtuse angles $\beta_1$ and $\beta_2$ with a top surface 163 of stack 110. A similarly shaped III-Phosphide based flip chip is disclosed in U.S. Pat. No. 6,229,160 (see FIG. 11), in which the superstrate shape of this embodiment is shown to enhance the efficiency with which light is extracted from the device.

Figure 30:
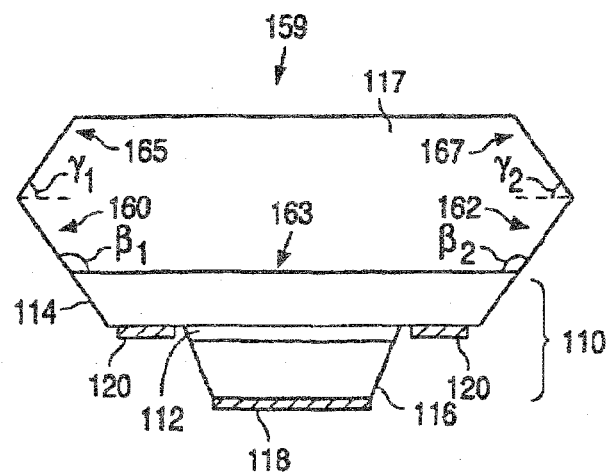

In another embodiment (FIG. 30), light-emitting device 159 includes superstrate 117 having, in addition to obtusely angled surfaces 160 and 162, surfaces 165 and 167 forming acute angles $\gamma_1$ and $\gamma_2$ with surface 163. The shape of light-emitting device 159, which may be formed with two sawing steps, for example, may combine the light extraction advantages of the embodiments shown in FIGS. 27 and 28. In other implementations, a light-emitting device having a substantially hexagonal cross-section as shown in FIG. 30, for example, may be formed with its active region located approximately at its widest point.

Figure 32:
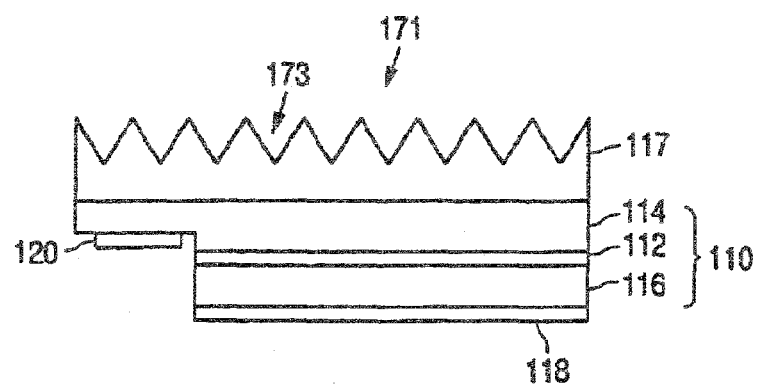

The extraction efficiency of the light-emitting devices shown in FIGS. 27, 28, 29, and 30 may be optimized, for example, by varying the thickness of superstrate 117 and by varying the bevel angles (e.g., $\alpha_1$, $\alpha_2$, $\beta_1$, $\beta_2$, $\gamma_1$, and $\gamma_2$) of the surfaces of superstrate 117 or by otherwise varying the shape of its surface. Although surfaces 148, 150, 154, 156, 160, 162, 165, and 167 are shown as sides in FIGS. 27, 28, 29, and 30, these surfaces may be located anywhere on the device. For example, the top surface of light-emitting device 171 (FIG. 32) is shaped by grooves 173 formed, for example, with a beveled or angled saw blade. Although grooves 173 are shown as having triangular profiles, other implementations may employ grooves having other shapes such as square grooves or grooves having sides inclined toward each other so that individual grooves are narrower at the top than at the bottom. These may be formed by wet (crystallographic) etching techniques.

Figure 31:
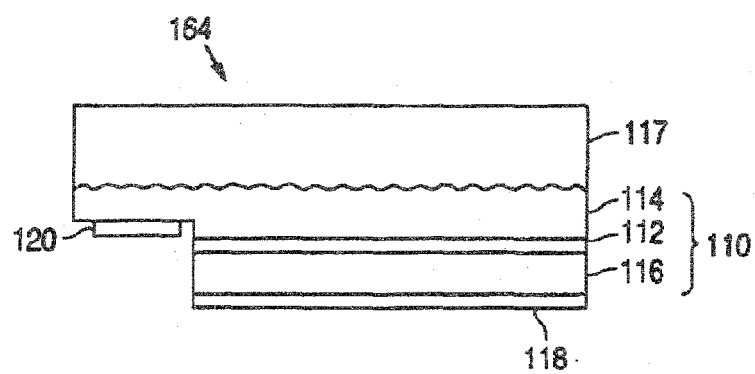

In other embodiments, the light extraction efficiency of the light-emitting device is improved by the inclusion of one or more interfaces that are roughened or textured to scatter light out of the device. In light-emitting device 164 (FIG. 31), for example, the interface between superstrate 117 and semiconductor region 114 is roughened. Other interfaces in light-emitting device 164 may also be roughened instead of or in addition to that shown in FIG. 31. Such roughened interfaces may be produced, for example, by etching, sawing, or milling.

Roughened interfaces may also be produced by patterned semiconductor bonding in which cavities are formed at the bonded interface and serve as scattering centers as described in U.S. Pat. Nos. 5,793,062 and 6,015,719, both of which are incorporated herein by reference in their entirety. These techniques may also be combined with photolithographic techniques. Roughened interfaces are also disclosed in U.S. Pat. No. 5,779,924, incorporated herein by reference in its entirety.

Figure 33:
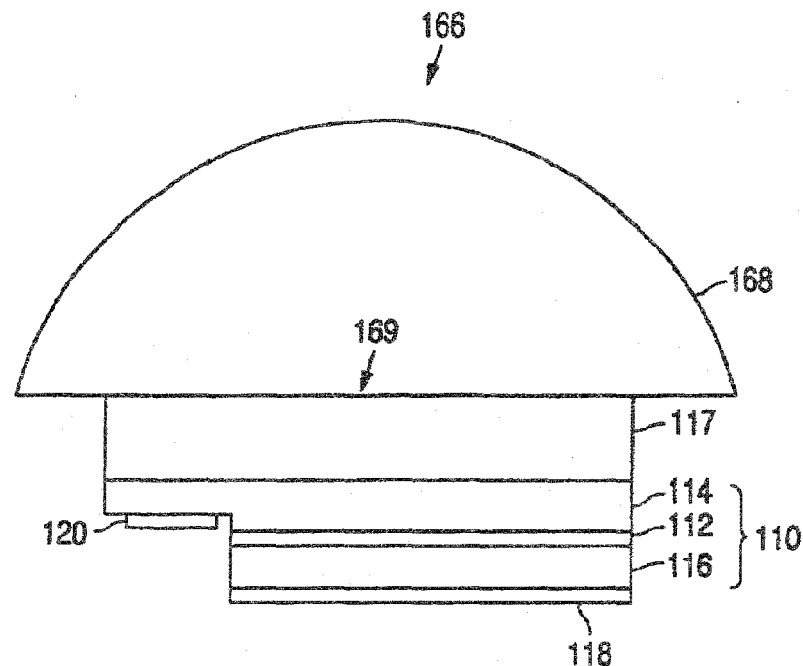
FIG. 33 schematically illustrates a light-emitting device including a lens in with another embodiment of the present invention.

In another embodiment (FIG. 33), the light extraction efficiency of a light-emitting device 166 is improved by attaching a lens 168 to surface 169 of superstrate 117. Attachment of lens 168 may be accomplished, for example, by bonding as described in U.S. patent application Ser. No. 09/660,317, assigned to the assignee of the present invention and incorporated herein by reference in its entirety. The angles of incidence at the curved surface of lens 168 for light entering the lens from superstrate 117 more closely approach normal incidence as the size of lens 168 is increased. Hence, it may be advantageous for the base of lens 168 (the flat surface) to be larger than surface 169 of superstrate 117 to which the lens is attached. In some embodiments, superstrate 117 is absent and lens 166 is attached to stack 110.

Conventional light-emitting devices are typically encapsulated in a low refractive index encapsulating material such as epoxy, for example, to improve light extraction efficiency. The embodiments shown in FIGS. 27, 28, 29, 30 and 33 may eliminate the need for such an encapsulant. Eliminating the encapsulant may allow for higher input electrical power and higher flux output without degradation of the device.

Another advantage of the III-Phosphide and III-Arsenide light-emitting devices disclosed herein is that they may be optically, mechanically, and electrically compatible with III-Nitride based flip chips such as those disclosed in U.S. Pat. No. 6,486,499. Consequently, the disclosed light-emitting devices may be easily and conveniently included in arrays with such III-Nitride flip chips. For example, in some embodiments light-emitting devices disclosed herein and III-Nitride flip chips may be mounted to a common substrate, submount, or heat sink with the same die-attach apparatus or with similar die-attach apparatus. This simplifies assembly of such an array. In addition, in some embodiments some of the optical characteristics (e.g., angular distribution of emitted light, output power) of devices disclosed herein and of III-Nitride flip-chips are substantially similar. This may allow simplification of the design of an optical system handling light output by such an array.

Figure 34:
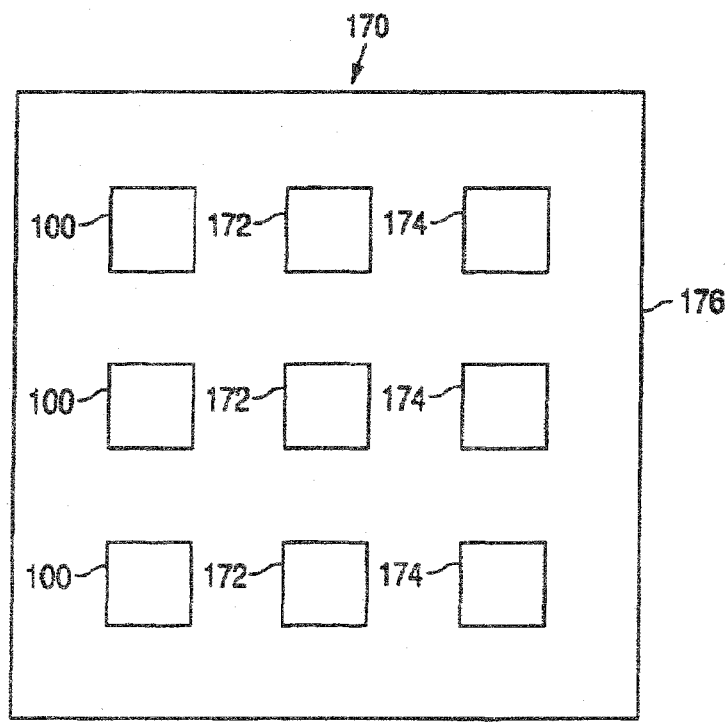
FIG. 34 schematically illustrates in a top view an array of light-emitting diodes in accordance with another embodiment.

Referring to FIG. 34, for example, in one embodiment an array 170 includes a plurality of light-emitting devices 100 (which may emit red, amber, or green light, for example, depending on the composition of their active regions), a plurality of green light-emitting III-Nitride devices 172, and a plurality of blue light-emitting III-Nitride devices 174 disposed on a substrate 176 (such as a printed circuit board, high thermal conductivity ceramic, or silicon substrate). In one implementation, all of the light-emitting devices in array 170 are mounted as flip chips. These flip chips may be attached to substrate 176 either directly or via submounts (as shown in FIG. 18, for example) disposed on substrate 176. Substrate 176 typically includes conductive traces which supply electrical power to the light emitting devices, and may optionally include additional circuitry such as, for example, circuitry to protect the light-emitting devices from electrostatic discharges. In other implementations, some of the light-emitting devices in the array are not mounted as flip chips. Also, in some implementations other III-Phosphide and III-Arsenide light-emitting devices disclosed herein may be substituted for light-emitting devices 100. One of ordinary skill in the art will recognize that, for example, red, green, and blue emission or blue and amber emission from the light-emitting devices in array 170 may be combined to provide apparently white light. Other combinations of colors emitted by light-emitting devices in array 170 may also provide apparently white light.

Arrays in other embodiments may include more or fewer colors of light-emitting devices than shown in FIG. 34. For example, in some embodiments devices 172 and/or devices 174 may not be present. Also, in other embodiments the light-emitting devices in an array may be arranged in a pattern differing from that shown in FIG. 34. Such arrays of flip-chip mounted red, amber, green, and blue light-emitting devices may be advantageously employed, for example, in various high power display and lighting applications which require multiple colors and/or white light. Arrays in yet other embodiments can also incorporated one or more luminescent materials that converts the wavelengths of light emitted by one or more light-emitting devices of the array to other wavelengths. In another implementation a coating on the top surface of superstrate 117, for example, includes a luminescent material. The luminescent material includes, for example, conventional phosphor particles, organic semiconductors, II-VI or III-V semiconductors, II-VI or III-V semiconductor quantum dots or nanocrystals, dyes, polymers, and materials such as GaN that luminesce from defect centers. Such luminescent coatings may be implemented, for example, as disclosed in U.S. Pat. No. 6,417,019, assigned to the assignee of the present invention and incorporated herein by reference in its entirety.

While the present invention is illustrated with particular embodiments, the invention is intended to include all variations and modifications falling within the scope of the appended claims.

What is being claimed is:

1. A light-emitting diode structure comprising:
   a multi-layer heterostructure, including a window portion and an active layer for generating light, said multi-layer heterostructure having a flat surface for emitting light, said window portion being transparent and having at least portions of one or more sides of said window portion at an oblique angle with respect to said flat surface, wherein said oblique angle is selected to increase the amount of light escaping from said sides of said window portion,
   wherein an inner angle of each angled side of the window portion with respect to the active layer is between 40-70 degrees,
   wherein a thickness of the window portion is greater than 50 microns,
   wherein the active layer is supported on a first surface of the window portion, the active layer emitting light from one surface into the window portion and emitting light from another surface away from the window portion, at least some light emitted away from the window portion being reflected back in an opposite direction, wherein said at least portions of one or more sides of said window portion extend outward as said window portion approaches said active layer, wherein at least some light emitted by the active layer in a direction perpendicular to the active layer impinges on the angled sides of the window portion, and wherein an ohmic contact electrically connects to the active layer, and wherein the ohmic contact comprises a reflector for reflecting light emitted from the active layer out of the light-emitting diode structure.

2. The diode of claim 1 wherein said window portion is at least a portion of a substrate.

3. The diode of claim 1 wherein said window portion is an insulator.

4. The diode of claim 1 wherein said window portion is a semiconductor.

5. The diode of claim 1 wherein said window portion is a substrate that has replaced a growth substrate on which said active layer was grown.

6. The diode of claim 1 wherein said window portion is frustum shaped wherein one or more entire sides of said window portion are at said oblique angle.

7. The diode of claim 1 further comprising a first ohmic contact formed on said window portion and a second ohmic contact formed on an opposite side of said heterostructure for providing electrical contact through said diode.

8. The diode of claim 1 wherein said oblique angle is not constant.

9. The diode of claim 1 further comprising a reflective electrical contact formed on a surface of said heterostructure opposite a primary light output surface of said diode.

10. The diode of claim 1 further comprising two ohmic contacts formed on a surface of said heterostructure opposite a primary light output surface of said diode for providing current through said diode.

11. The diode of claim 1 wherein said window portion comprises GaP.

12. The diode of claim 1 wherein said active layer is formed by a combination of materials selected from the group consisting of Al, In, Ga, and P.

13. The diode of claim 1 wherein the entire multi-layer heterostructure forms a truncated pyramid.

14. The diode of claim 1 wherein said window portion is a first window portion, said diode further comprising a second window portion on a side of said active layer opposite the side facing said first window portion.

15. The diode of claim 1 further comprising an epoxy encapsulating said multi-layer heterostructure.

16. The diode of claim 1 wherein a surface of said active layer has an area greater than an area of a surface of said window portion facing away from said active layer.

17. The diode of claim 1 wherein a primary light output surface of said diode is other than a surface of said window portion.

* * * * *